(12) United States Patent
Rinerson et al.

(10) Patent No.: US 7,180,772 B2
(45) Date of Patent: Feb. 20, 2007

(54) HIGH-DENSITY NVRAM

(75) Inventors: Darrell Rinerson, Cupertino, CA (US); Steven W. Longcor, Mountain View, CA (US); Edmond R. Ward, Monte Sereno, CA (US); Wayne Kinney, Emmett, ID (US)

(73) Assignee: Unity Semicondutor Corporation

( * ) Notice: Subject to any disclaimer, the term of this patent is extended or adjusted under 35 U.S.C. 154(b) by 79 days.

(21) Appl. No.: 11/179,790

(22) Filed: Jul. 11, 2005

(65) Prior Publication Data

US 2006/0023495 A1 Feb. 2, 2006

Related U.S. Application Data

(63) Continuation of application No. 10/360,005, filed on Feb. 7, 2003, now Pat. No. 6,917,539.

(60) Provisional application No. 60/424,083, filed on Nov. 5, 2002, provisional application No. 60/422,922, filed on Oct. 31, 2002, provisional application No. 60/400,849, filed on Aug. 2, 2002.

(51) Int. Cl.
*G11C 11/14* (2006.01)

(52) U.S. Cl. .................. 365/171; 365/173; 365/158

(58) Field of Classification Search ............... 365/171, 365/158, 173
See application file for complete search history.

(56) References Cited

U.S. PATENT DOCUMENTS 3,886,577 A 5/1975 Buckley

| | | | |
|---|---|---|---|
| 5,296,716 A | 3/1994 | Ovshinsky et al. | |
| 6,204,139 B1 | 3/2001 | Liu et al. | |
| 6,473,332 B1 | 10/2002 | Ignatiev et al. | |
| 6,531,371 B2 | 3/2003 | Hsu et al. | |
| 6,753,561 B1 | 6/2004 | Rinerson et al. | |
| 6,836,421 B2 | 12/2004 | Rinerson et al. | |
| 6,856,536 B2 | 2/2005 | Rinerson et al. | |
| 6,917,539 B2 | 7/2005 | Rinerson et al. | |
| 7,095,643 B2 * | 8/2006 | Rinerson et al. | .......... 365/63 |
| 2005/0151156 A1 | 7/2005 | Wu et al. | |

OTHER PUBLICATIONS

A.Baikalov, et al, "Field -driven hysteretic and reversible resistive switch at the Ag-Pr0.7Ca0.3MnO3 interface" Applied Physics Letters, vol. 83, No. 5, Aug. 4, 2003, pp. 957-959.

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

A. Sawa, et al, "Hysteretic current-volyage characteristics and resisitanc4e switching at a rectifying Ti/$Pr_{0.7}Ca_{0.3}MnO_3$ interface" Applied Physics Letters, vol. 85, No. 18, Nov. 1, 2004, pp. 4073-4075.

(Continued)

*Primary Examiner*—Tuan T. Nguyen
*Assistant Examiner*—Pho M. Luu

(57) ABSTRACT

A cross point array and peripheral circuitry that accesses the cross point array. The peripheral circuitry receives a supply voltage of approximately 1.8 volts or less, generates voltages of a magnitude not more than approximately 3 volts, and senses current that is indicative of a nonvolatile memory state.

19 Claims, 17 Drawing Sheets

OTHER PUBLICATIONS

U.S. Appl. No. 60/536,115, filed Jan. 13, 2004, Wu et al.

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, "New Conduction and Reversible Memory Phenomena in Thin Insulating Films," Proc. Roy. Soc. A., 301 (1967), pp. 77-102.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

Liu et al., "Electric-pulse-induced reversible resistance change effect in magnetoresistive films," Applied Physics Letters, vol. 76, No. 19, May 8, 2000, pp. 2749-2751.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transition and nonvolatile memory in chromium-doped $SrTiO_3$ single crystals," Applied Physics Letters, vol. 78, No. 23, Jun. 4, 2001, pp. 3738-3740.

* cited by examiner

HIGH-DENSITY NVRAM

CROSS-REFERENCE TO RELATED APPLICATIONS

This application is a continuation of U.S. patent application Ser. No. 10/360,005, filed on Feb. 7, 2003, now U.S. Pat. No. 6,917,539, which claims the benefit of U.S. Provisional Application No. 60/400,849, filed Aug. 2, 2002, U.S. Provisional Application No. 60/422,922, filed Oct. 31, 2002, and U.S. Provisional Application No. 60/424,083, filed Nov. 5, 2002 all of which are incorporated herein by reference in their entireties and for all purposes.

BACKGROUND OF THE INVENTION

1. Field of the Invention

The present invention relates generally to memory, and more specifically to NVRAM.

2. Description of the Related Art

Most digital electronic systems have two generic memory requirements: an operating memory whose primary technical requirements are fast read and write and no wear out, and a storage memory (for data and/or program store) whose primary technical requirements are non-volatility and the ability to read many times without significant data degradation. The ideal memory would satisfy both these needs in a single device. In addition, the ideal memory will also achieve considerable cost/bit reductions as compared to existing memories.

Near ideal operating characteristics might be as follows:
Reads and writes <100 ns
Retains data after the power supply has been removed (non-volatile)
Operates at low power supply voltage
Has low active and standby currents
Does not wear out with read/write cycling
Has low cost/bit
Has simple read & write operation in a system Wear out is the phenomena whereby a memory will fail to work after a certain number of read/write cycles. This number is usually between 100,000 to 10,000,000 read/write cycles. For a memory to have zero wear out, it would need the capability of cycling a minimum of $10^{15}$ read/write cycles.

While the present semiconductor memories that are currently in high volume commercial production today are far from meeting ideal specifications, they have achieved a large measure of commercial success because they work reasonably well at an acceptable cost. The major drawbacks from currently available non-volatile memories are as follows.

Have long write times that range from 5 us (microseconds) to 100 s of ms (milliseconds).
Wear out after a few hundred thousand read/write cycles.
Have a complex user operation that involves a separate erase operation.

However, the key parameter for most markets is cost/bit. Any solution that is more costly on a cost/bit basis will likely be relegated to a niche market.

Recently, there have been announcements of new technologies that are being investigated that could result in memories with closer to ideal operating characteristics. None of these new technologies have yet become a commercial reality. The leading contenders for the next generation memory are likely:

MRAM-MTJ (Magnetic RAM, Magnetic Tunnel Junction)
MRAM-GMR (Magnetic RAM, Giant Magneto Resistance)
OUM (Ovonics Unified Memory)
FeRAM-1T1C Ferroelectric RAM with 1 Transistor, 1 Capacitor
FeRAM-1T Single Transistor Ferroelectric FET
Ferroelectric Polymer
Chalcogenide Metal (Ag) Dendrite There has been a fair amount of press given to each of the above technologies over the past few years. Unfortunately, none of the most promising technologies have achieved any measure of wide commercial success to date. The details on each of the above emerging memory technologies are as follows:

MRAM-MTJ is a very complex structure, and there appears to be problems scaling the cell size and the write current. While MRAM-MTJ has performance benefits, it is significantly more expensive than other solutions. There are some technical concerns about its scalability based upon the fundamental physics of magnetic materials, which will likely be very difficult to overcome. Unless MRAM can scale to small dimensions, it will be more expensive on a cost per bit, and not achieve wide acceptance in the market.

MRAM-GMR also is a structure that is physically large and so the same questions of cost/bit apply.

The OUM is a memory technology that has been around for 30+ years. In the past several years there has been a renewed interest in this technology, and presently the technology is at the stage of a feasibility design. However, there are still some technical difficulties associated with this technology due to the fact that the material is heated up to its melting point, during the write operation.

The FeRAM1T is a very new technology that solves the problem of fast writing, but has a significant cost penalty. This technology will likely never be less costly than standard Flash memory. It may have other advantages that make it suitable for certain niche applications.

The Ferroelectric polymer memory has slow performance and high temperature operating limitations at <85° C. However, it offers significantly lower cost per bit.

The Chalcognide Metal (Ag) Dendrite memory is in early stages of development, and its long-term success is unknown. Its electrical characteristics are such that it is unlikely to function as a non-volatile memory. Its high temperature (100° C.) characteristics are marginal as well as its data retention characteristics.

Table 1 summarizes each of the above emerging technologies.

TABLE 1

|  | Non-Volatile | RAM Operation | Cost |
| --- | --- | --- | --- |
| MRAM | Yes | Yes | High |
| OUM | Yes | Yes | Low |
| FeRAM 1T1C | Yes | Yes | Medium |
| FeRAM 1T | Yes | Yes | Medium |
| Polymer | Yes | No | Very Low |
| Metal Dendrite | ? | Yes | ? |

SUMMARY OF THE INVENTION

The present invention provides a high density NVRAM. In one embodiment the NVRAM includes an array of memory cells capable of storing at least a megabit of information and peripheral circuitry. Each memory cell in the array includes a memory plug that includes a memory element that switches from a first resistance state to a second resistance state upon application of a first write voltage of a first polarity and reversibly switches from the second resistance state to the first resistance state upon application of a second write voltage of polarity opposite to the first polarity. The peripheral circuitry is capable of supplying the first write voltage and the second write voltage to a memory cell or a group of memory cells and is capable of determining the resistance states of a memory cell or a group of memory cells.

In some embodiments, the NVRAM is capable of inputting and outputting N digit words and the array of memory cells and the peripheral circuitry are divided into N bit blocks such that each bit block is associated with a single digit from the N digit word and each bit block has the essentially the same architecture.

In other embodiments, the memory cells are arranged in a cross point array, which may have multiple layers of memory cells. In multiple-layer cross point arrays, some conductive array line layers can be commonly controlled. In yet other embodiments, the memory plugs of the cross point array may include a non-ohmic device coupled to the memory element that imparts a high resistance to the memory plug at low voltages and a low resistance to the memory plug at high voltages. Therefore, leakage current is limited at low voltages and current is able to flow at high voltages. Specifically, a low voltage might be considered to be approximately one-half of the first write voltage and approximately one-half of the second write voltage. A high voltage might be the first write voltage and the second write voltage. Applying approximately one-half of the voltage to the memory plug via a first array line and applying approximately one-half of the voltage via a second array line can be used to apply a full write voltage to a particular memory cell while unselected cells are not subject to excessive current.

In other embodiments, the second resistive state of the memory elements is at least about 10 times greater than the first resistance state.

In other embodiments, the memory plugs of the high-density NVRAM could have three or more levels of resistive states, allowing storage of more than one bit of data per memory cell.

In other embodiments, the high-density NVRAM also includes read circuitry that can read a stored value from a memory plug by applying approximately one-half of a first read voltage of a first polarity to the memory plug via a first array line and applying approximately one-half of the first read voltage via a second array line. It yet other embodiments, the read circuitry can additionally read a stored value from the memory plug by applying approximately one-half of a second read voltage of a polarity opposite to the first polarity to the memory plug via the first array line and applying approximately one-half of the second read voltage via the second array line.

SUMMARY OF THE INVENTION

The present invention provides an apparatus that includes a high density NVRAM having both a cross point array and peripheral circuitry. A cross point array has at least two layers of conductive array lines. The conductive array lines of the first layer are arranged so that they do not come into direct contact with each other and have a plurality of bottom memory plug sites. The conductive array lines of the second layer are arranged so that they cross over the conductive array lines of the first layer without coming into direct contact with each other or any of the conductive array lines of the first layer. Each conductive array line of the second layer has a plurality of top memory plug sites that is located directly above a corresponding bottom memory plug site. Disposed in between the memory plug site pairs are nonvolatile memory elements that store information.

The peripheral circuitry receives a supply voltage of approximately 1.8 volts or less, generates voltages to the conductive array lines of a magnitude not more than approximately 3 volts, senses current that is indicative of a nonvolatile memory state. If +3 volts and −3 volts are the maximum voltage on any one conductive array line, the maximum voltage drop across a memory plug site pair can be as much as ±6 volts.

DETAILED DESCRIPTION OF THE PREFERRED EMBODIMENTS

INTRODUCTION—OVERVIEW

Figure 1:
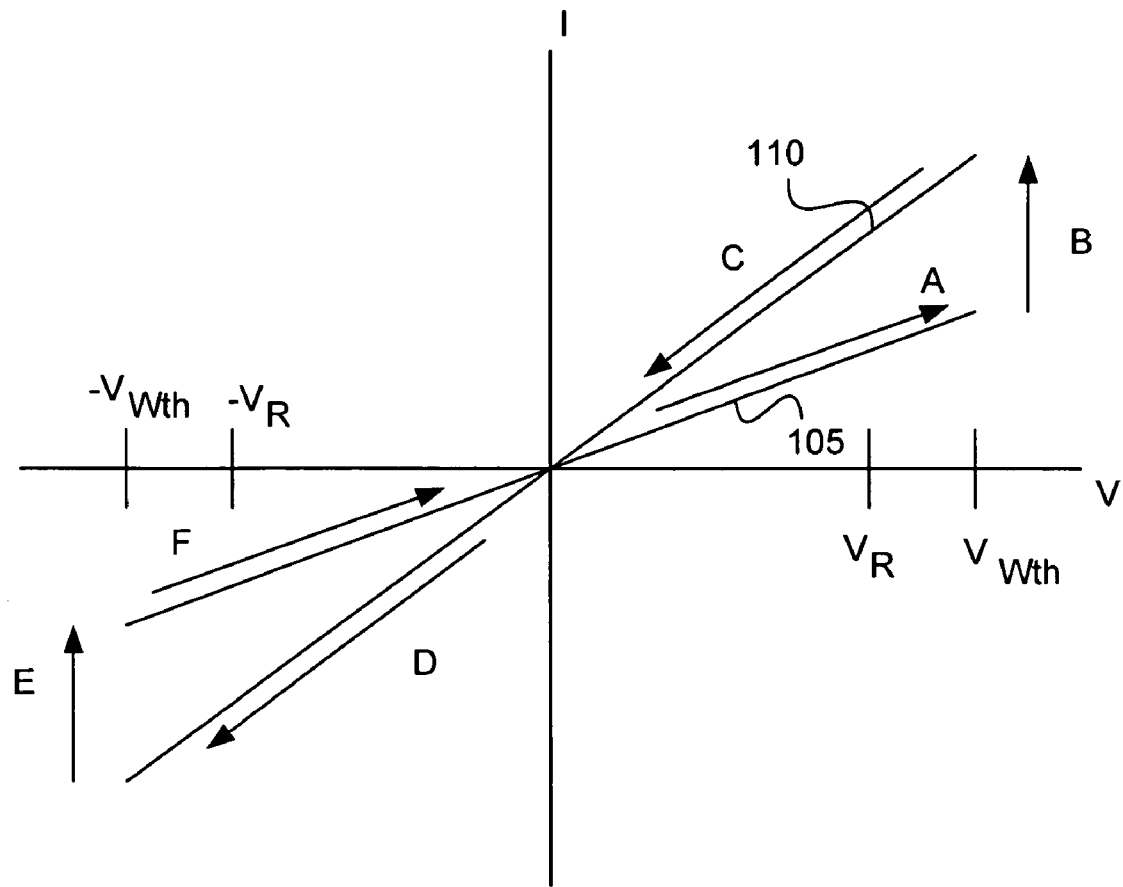
FIG. 1 is a graph depicting the basic current-voltage characteristics of a two-state (single bit) resistive memory element suitable for use in memory plugs.

The present invention attempts to move memory technology closer to near ideal operating characteristics. It is theorized that the fundamental concepts of the present invention will ultimately allow the creation of memory that is:

Nonvolatile with a minimum of 10 years data retention at 125° C.

At least ½ the cost of any other CMOS memory.

Fast read <70 ns and Fast write <70 ns and Fast cycle time <70 ns

Low Voltage Operation, Vcc=1.2–1.8 V

Low Active Current <30 ma and Low Standby Current <10 ua

No wear out after a minimum of $10^{15}$ read/write cycles

Such ideal memory would likely need to be based on both new memory architectural features as well as new memory materials. Architectural features would probably include:

Cross point Memory Array

Multi layers of memory

Multi levels of memory (more than one bit/cell).

Therefore, to make an ideal RAM not only does one need a material with the right memory characteristics, but also one that is compatible with the above chip architectural features.

Recently discovered electrical effects in certain complex metal oxides are promising steps in the right direction. Specifically, the conductivity of the material can be switched back and forth between two values by the use of an electric field.

However, for these newly discovered materials to be effectively used, specific electrical properties should include:

Switches from one resistance state to another in less than 30 ns.

The voltage that is used to switch the material is consistent, and is approximately 2 to 3 volts. It should be selectable by adjusting the thickness of the material.

The cell can be read with a voltage, approximately 1 volt, that is lower than the write voltage and can interrogate the resistance of the memory cell without disturbing the contents of the cell, even up to $10^{15}$ reads.

The data is retained in the cell for up to 10 years at 125° C. after the last write to the cell.

The cell will operate at temperatures from −45° C. to 85° C.

The cell will write up to $10^{15}$ times without wear-out.

The conductivity of the material in the low resistance state is approx. 1 Ω-cm.

The inventors theorize that there are two general classes of metal oxides to research in order to determine if the material has the required electrical properties. It should be noted that the materials that have been studied to date have many if not most of the needed characteristics, though no single material has the all the optimal properties.

Class 1: The Manganites are the first class of metal oxides that should be investigated. Some examples of the particular materials are as follows:

| PCMO | $Pr_{.7}Ca_{.3}MnO_3$ |
| LCMO | $La_{.7}Ca_{.3}MnO_3$ |
| LSMO | $La_{.7}Sr_{.3}MnO_3$ |

Class 2: The Titanates and Zirconates are the second class of materials that should be investigated. Some examples of the particular materials are as follows:

| SZO | $SrZrO_3$ |
| STO | $SrTiO_3$ |

Fabrication of thin films are processed by either solution based spin on followed by high temperature anneal, pulsed laser deposition (PLD), sputtering, and metalorganic chemical vapor deposition (MOCVD). The thin films can be characterized by stoichiometry, element substitution, bottom electrode (seed layer), top electrode, and deposition method.

The Memory Plug

A high density NVRAM requires both an array of memory cells and peripheral circuitry driving the memory cells. The memory cells include a memory plug and a mechanism, such as conductive array lines, that deliver current to the memory plug.

The principal components of the memory plug include (a) a memory element, (b) a non-ohmic device for modifying the current-voltage characteristics of the memory element, and optionally (c) other components that may be necessary in certain embodiments to address materials and fabrication considerations. Most fundamentally, the memory plug should include two or more resistance states that can be distinguished during a read operation. These states should be reversible by application of a stimulus such as an electric field of specified size and polarity. Further the states should not be easily disturbed. Thus, the resistance of the material as a function of the stimulus should exhibit hysteresis.

The memory elements impart the distinct resistance states. Memory elements with three or more distinct resistance states allow multi-bit memory plugs (also referred to as multi-level memory plugs), which will be discussed later. The present discussion will focus on two-state memory plugs that store a single bit of information. Also, for consistency throughout this document, the lower resistance state of the memory plug will be referred to as providing a value of 1 and the higher resistant state will be referred to as providing a value of 0.

When the stimulus driving state change is voltage, the memory element switches between one resistance state and another by application of at least a threshold write voltage (deemed $V_{Wth}$ herein). To change resistance states in one direction (e.g., from 1 to 0), a write voltage $V_W$ is applied. To change states in the opposite direction, a write voltage of the opposite polarity ($-V_W$) is applied. The magnitude of $V_W$ must be greater than $V_{Wth}$.

The non-ohmic device imparts a very high resistance at low applied voltages (and a low resistance at high voltages), which prevents the unselected plugs from being disturbed during normal read and write operations and minimizes unwanted power dissipation during such operations. Preferably, the memory plugs are accessed via conductive lines of a cross point array, although many other configurations appropriate for particular applications.

FIG. 1 depicts the basic current-voltage characteristics of a two-state (single-bit) resistive memory element suitable for use in memory plugs of this invention. A high resistance state is illustrated by a V-I line 105 and a low resistance state is illustrated by a V-I line 110. If the memory element is initially in the high resistance state 105, and a voltage pulse of either positive or negative polarity is applied, the memory element will transition into the low resistive state 105.

Afterwards, a voltage pulse of an opposite polarity from the initialization voltage pulse will return the memory element to the high resistance state.

The I-V characteristics depicted in FIG. 1 may be acceptable for some applications, but there are two issues that encourage a modified I-V characteristic for other applications. First, to minimize disruption of unselected plugs on a selected line during read and write operations, it may be desirable to have a very high resistance at voltages near zero. Additionally, to minimize current dissipation during normal operation, the same characteristic is desirable. In some designs, unselected plugs on a selected line are exposed to a fractional voltage, such as one-half the voltage required to read or write from the selected plug. Ideally, this fractional voltage will be in a region of the I-V profile where minimal current is drawn. To this end, the memory plug employs a non-ohmic device. The non-ohmic device preferably has a high resistance when exposed to the fractional voltages and a low resistance when exposed to the full read or write voltages. Since read and write voltages are both positive and negative, the non-ohmic device is preferably, though not necessarily, symmetric and not uni-directional.

In the half select embodiment, an x direction conductive array line receives the fractional voltage of one-half the read voltage or one-half the write voltage during read and write cycles, respectively. Similarly, the corresponding y direction array line receives one-half the read voltage or one-half the write voltage. That way, only the selected plug at the x-y intersection sees the full value read or write voltage, while other plugs on each line see only one-half the read or write voltage. When coupled with an appropriate I-V resistance characteristic, disruption to unselected plugs and unwanted current dissipation is minimized. The half select feature will be described in more detail below.

As indicated, a preferred memory array for use with the memory plugs of this invention is a cross point array. Generally, a cross point array is a memory array of orthogonal conductive array lines intersecting at memory plugs. The memory plug footprints correspond closely to the perimeters defined by intersecting conductive array lines. Thus, memory plugs in a cross point array should be small. To this end, the memory plugs employed in certain embodiments of this invention do not employ access transistors or similar active components. Cross point array designs suitable for use with this invention will be described in more detail below.

Figure 2A:
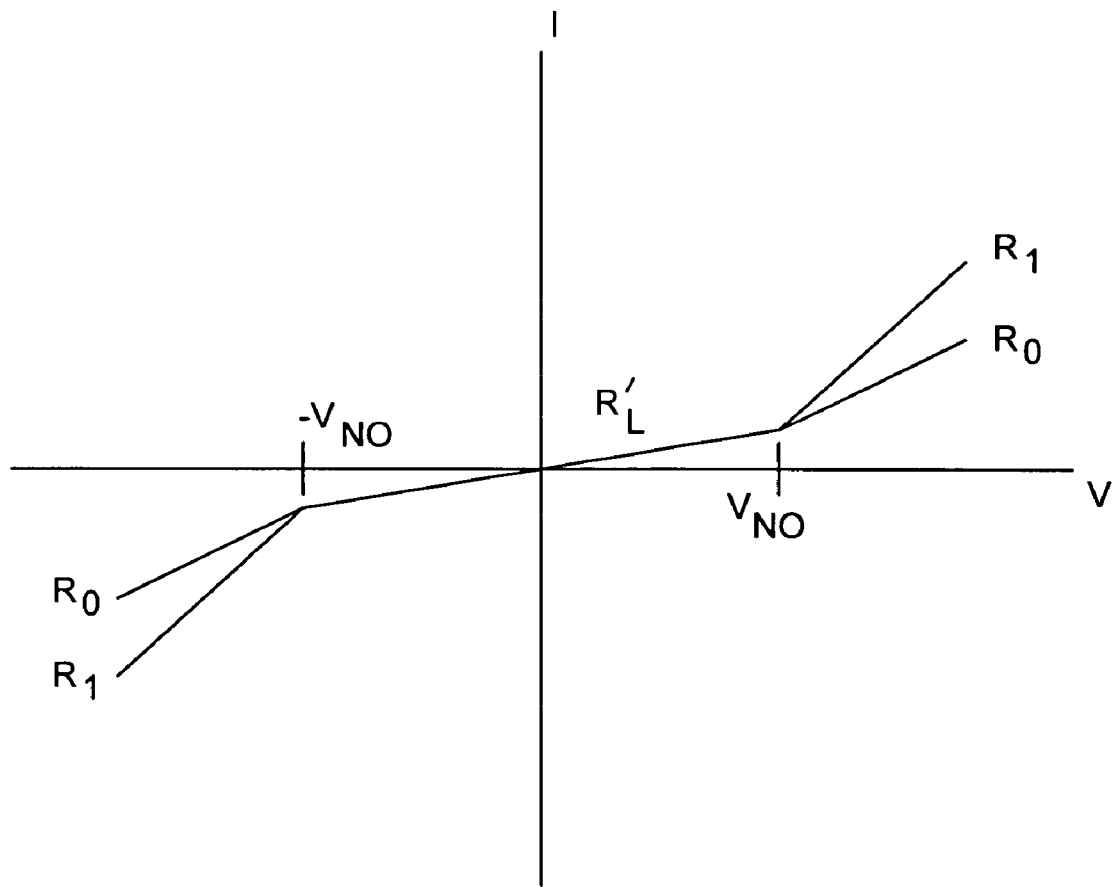
FIG. 2A is a graph depicting an example of preferred I-V characteristics for a memory plug.

An example of preferred I-V characteristics for a memory plug of this invention is depicted in FIG. 2A. Note that the plug may include a memory element that has the I-V characteristics depicted in FIG. 1 and a non-ohmic device that has the I-V characteristics depicted in FIG. 2B. When such components are coupled, the overall memory plug has the I-V characteristics depicted in FIG. 2A.

Figure 2B:
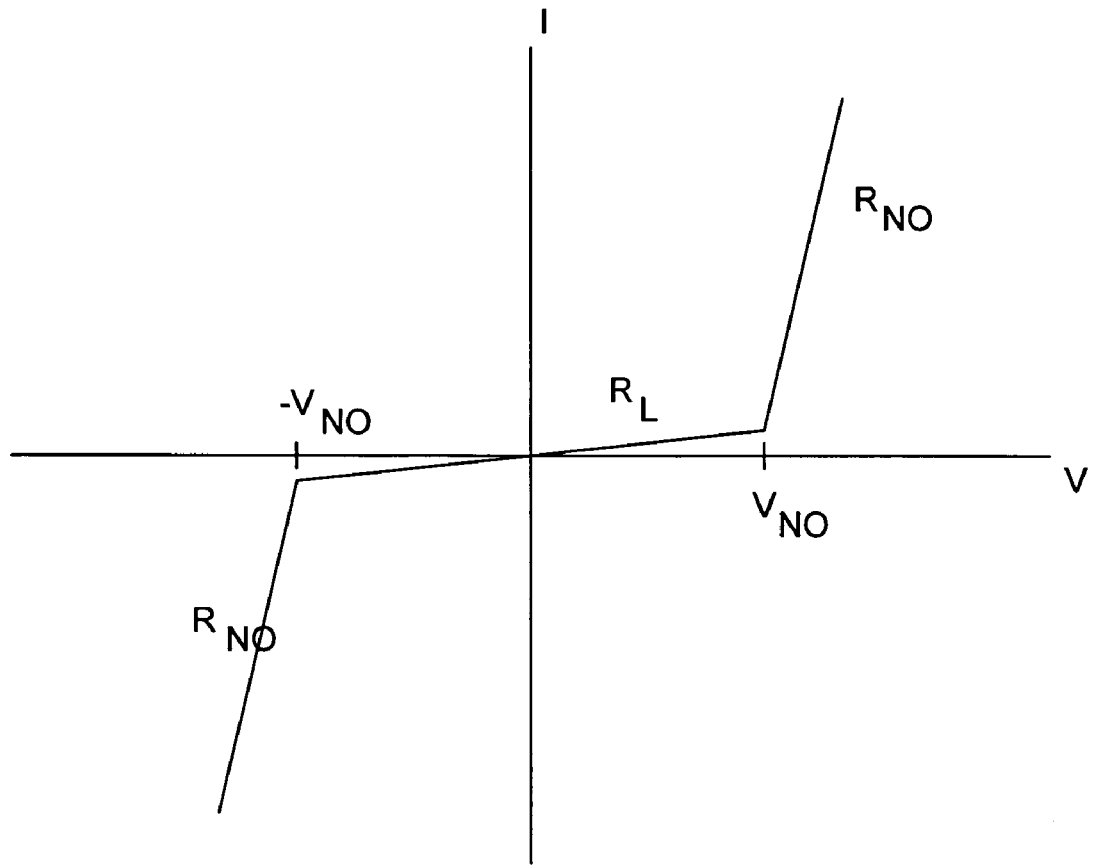
FIG. 2B is a graph depicting an example of preferred I-V characteristics for a non-ohmic device.

As depicted in FIGS. 2A and 2B, the memory plug has a very high resistance regime near zero volts. This regime resides between voltages $-V_{NO}$ and $V_{NO}$, and has a resistance designated $R_L$. Beyond these voltages, the circuit component depicted in FIG. 2B goes to a very low resistance state labeled $R_{NO}$.

When a non-ohmic circuit element having the I-V characteristics depicted in FIG. 2B is connected in series with a memory element having the I-V characteristics depicted in FIG. 1, a memory plug having the characteristics depicted in FIG. 2A results. As shown in FIG. 2A, the memory plug maintains a high resistance of $R_L'$ (about equal to $R_L$) in the voltage domain between $-V_{NO}$ and $V_{NO}$. Beyond this domain (in both the negative and positive voltage domains), the resistance of the memory plug splits into two states $R_1$ and $R_0$ as depicted.

Figure 2C:
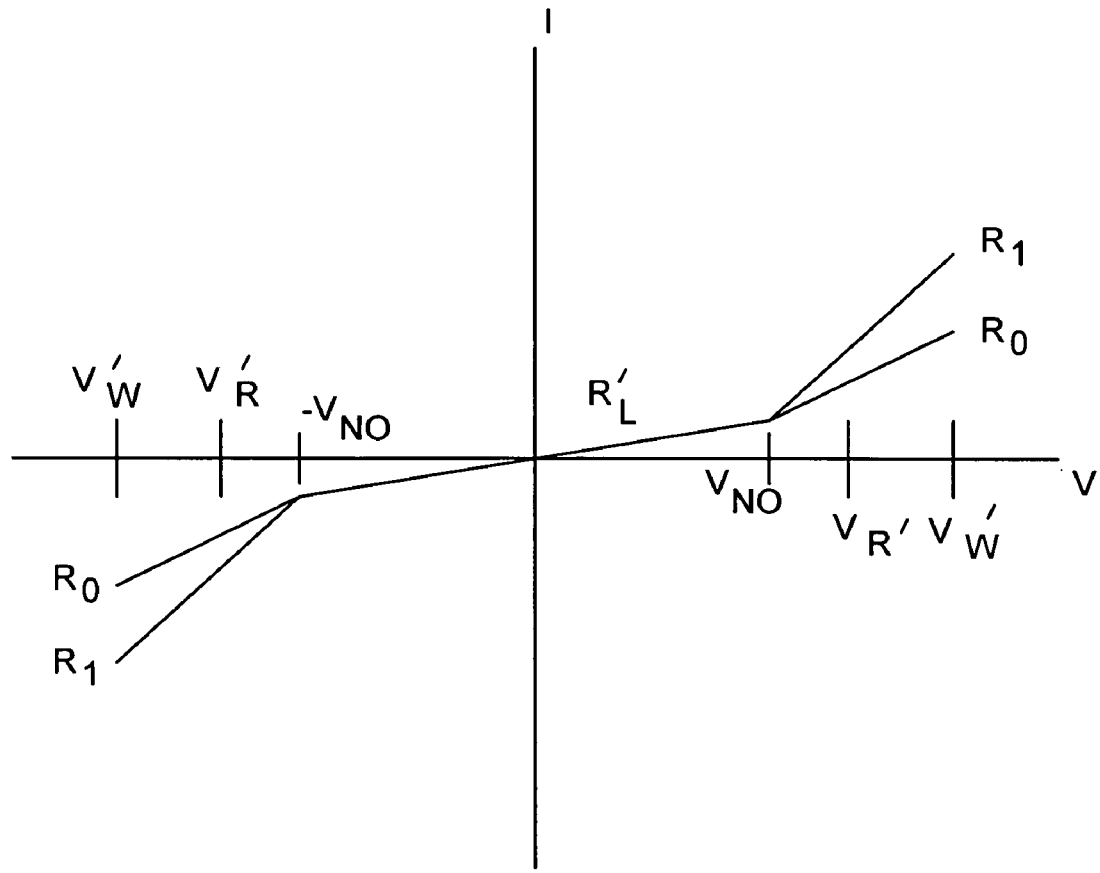
FIG. 2C is a graph depicting an example of preferred I-V characteristics superimposed with the indicators of read and write voltages.

FIG. 2C depicts the I-V characteristics shown in FIG. 2A superimposed with the indicators of read and write voltages. To understand this Figure, recognize that there are two characteristic read voltages and two characteristic write voltages associated with the memory plug. One of these is for the simple memory element itself as depicted in FIG. 1. The other is for the overall plug, including the memory element and the non-ohmic device. As defined before, the write voltage $V_W$ and the read voltage $V_R$ are the voltages seen by the memory element of the memory plug. If the memory plug includes additional circuitry possessing the I-V characteristics depicted in FIG. 2B, for example, then an additional read and write voltage must be defined: one that is seen by the entire memory plug, not just the memory element of that plug. The magnitudes of these whole-plug read and write voltages (denoted $V_R'$ and $V_W'$) are equal to the required read and write voltages of the memory element in combination with the additional voltage needed to compensate for the non-ohmic device (and any other additional elements that provide a voltage drop).

As depicted in FIG. 2C, in a preferred implementation, a value of $V_R'$ resides a relatively small distance on the voltage scale to the positive side of $V_{NO}$, past where the two resistance states branch apart. Similarly, $-V_R'$ resides a relatively small distance to the negative side of $-V_{NO}$ on the voltage scale. Further, the voltages $V_W'$ and $-V_W'$ reside somewhat beyond the magnitudes of $V_R'$ and $-V_R'$ on the voltage scale. Note that the plug will also have characteristic threshold write voltages $V_{Wth}'$ and $-V_{Wth}'$, not shown, at which the resistance actually changes state. $V_W'$ will always be greater than or equal to $V_{Wth}'$.

To read from a memory plug having the I-V characteristics of FIG. 2C, one preferably applies a voltage of $V_R'$ across the memory plug. Similarly, to write to such memory plug, one applies a voltage of $V_W'$ (or $-V_W'$) across the memory plug. As indicated, a high-density NVRAM employing peripheral circuitry that applies one-half of the read or write voltage via one array line and one-half of the read or write voltage (of opposite polarity) an orthogonal array line is ideally suited for use with memory plugs that have the I-V characteristics depicted in FIG. 2C.

The memory plug I-V parameters of interest include $R_1$ and $R_0$ (the resistances of the memory plug when the memory element is in its low state or its high state), $V_W$ and $V_R$ (the write and read voltages experienced by the memory element), $V_W'$ and $V_R'$ (the write and read voltages experienced by the whole memory plug), $V_{NO}$ (the voltage at which the memory plug transitions from a very high resistance state to two distinctly separate resistance states ($R_1$ and $R_0$)), $R_L$ (the resistance associated with the range between $-V_{NO}$ and $V_{NO}$ for the non-ohmic device), $R_L'$ (the resistance associated with the range between $-V_{NO}$ and $V_{NO}$ across the entire plug), and $R_{NO}$ (the resistance of the non-ohmic circuit element at voltage magnitudes beyond $V_{NO}$). Some fairly straightforward design constraints allow one to implement a working memory plug.

For example, if about 1000 Å of a memory element material were used, then $V_{Wth}$ would be about 2V for the memory element. If a maximum current of 10 µA were desired, and the resistive states of the memory element were desired to be an order of magnitude apart, then a $V_R$ of 1V might cause a particular memory element to exhibit a low resistive state of 100 kΩ and a high resistive state of 1MΩ.

A $V_R$ of IV would also be far enough from $V_{Wth}$ to prevent a read from disturbing the memory element.

For the above example, assuming there are not any other additional elements that provide a voltage drop, $V_{NO}$ would need to be at least 2V to realize the full benefits of the non-ohmic circuit element during a half-select write (The minimum $V_{NO}$ can be calculated from $V_{NO}=\frac{1}{2}V_W'=\frac{1}{2}(V_{NO}+V_W)=V_W$). A $V_{NO}$ of 2V would cause $V_W'$ to be 4V and $V_R'$ to be 3V. However, a higher $V_{NO}$ might be appropriate to allow for some fabrication inconsistencies and other additional elements in the memory plug that provides a voltage drop. If the CMOS fabrication process is then restricted to having no more than ±3V on the memory device, then the maximum $V_W'$ would be 6V. Therefore, if 1000 Å of a memory element required 2V to change its resistive state, a maximum current of 10 µA was desired, and a read operation could detect a 10× change from one resistive states to the next, $V_W'$ would be chosen to be between 4V and 6V, $V_R'$ to be between 3V and 5V and $V_{NO}$ to be between 2V and 4V.

The actual physical structure of a memory plug may take many different forms. In a preferred embodiment, it minimally includes a layer of the material comprising the memory element sandwiched between two separate conductive array lines. Preferably, the memory plug will also include a non-ohmic device located with the memory element, between the two array lines. As mentioned, such non-ohmic device preferably provides the I-V characteristics depicted in FIG. 2B.

Figure 3A:
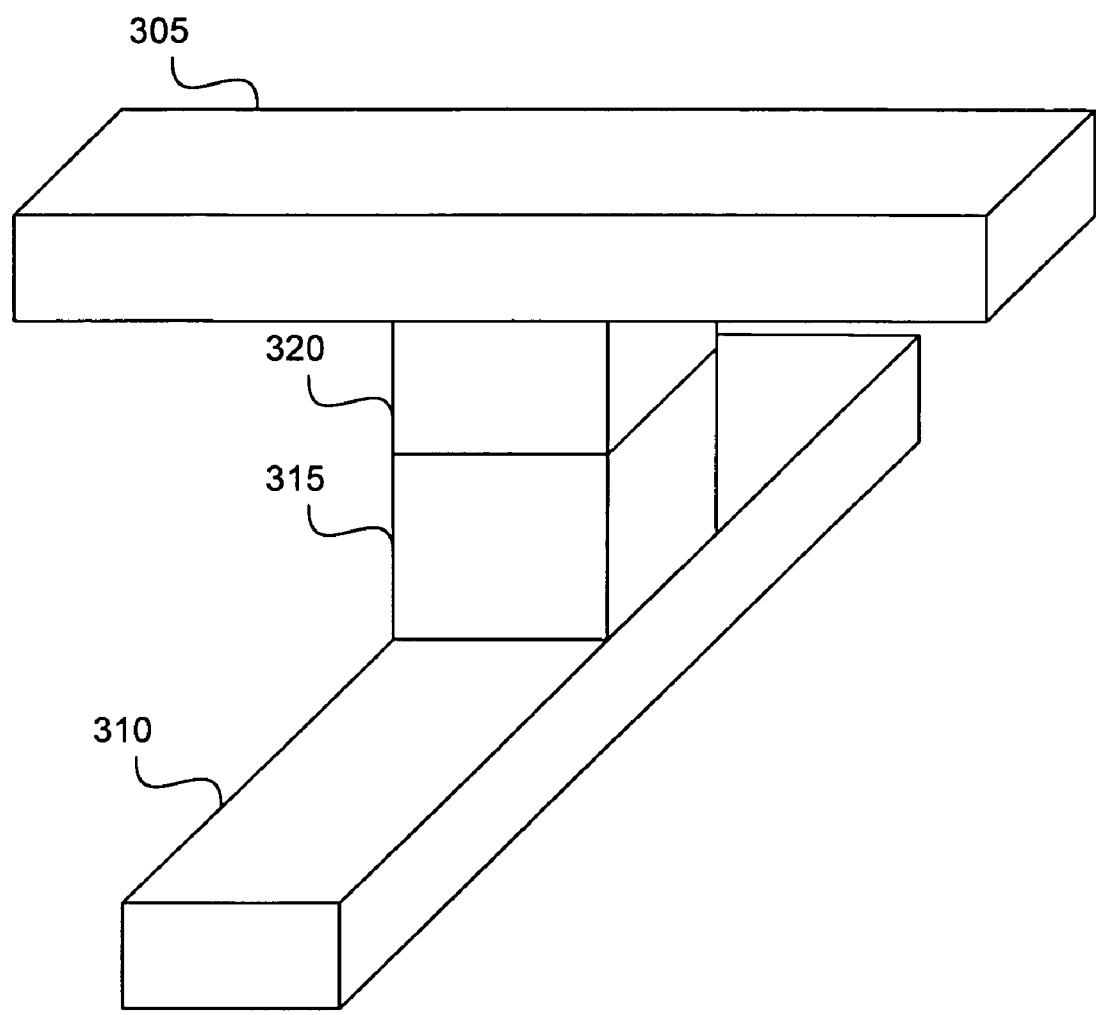
FIG. 3A is a perspective view of one example of a memory plug structure in a cross point array.
Figure 3B:
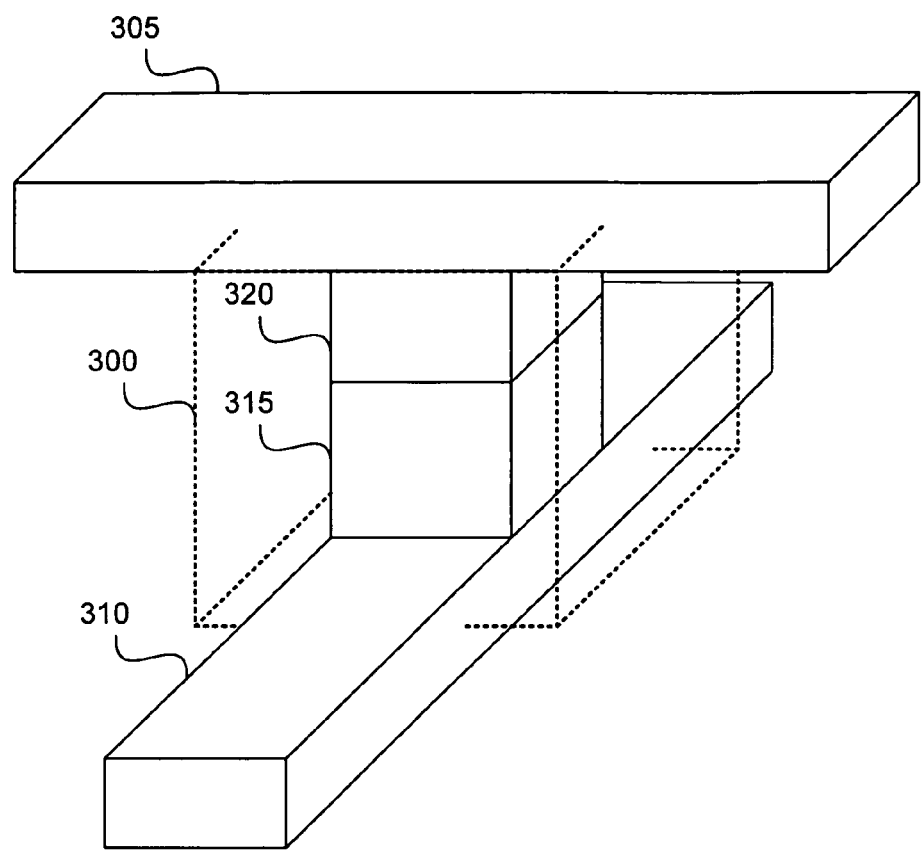
FIG. 3B is a perspective view of one example of a repeatable memory cell of the memory array.
Figure 3C:
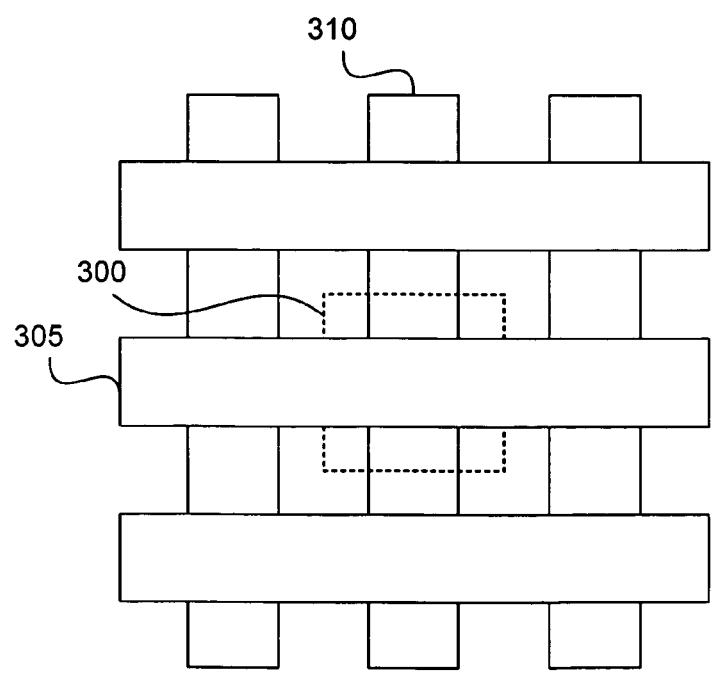
FIG. 3C is a plan view depicting one example of a memory cell in a memory array.

FIG. 3A depicts one example of a memory plug structure in a cross point array. A first conductive array line 305 and a second conductive array line 310 serve as contacts for the memory plug. In other embodiments, separate contacts or electrodes may be provided within the memory plug. These could be conductive barrier layers, seed layers, etc. that electrically contact conductive array lines 305 and 310. In the example depicted in FIG. 3A, no such separate contacts are depicted. In this example, a memory element 315 sits directly on lower conductive array line 310. A non-ohmic circuit device 320 is sandwiched between resistive memory element 315 and upper array line 305. FIGS. 3B and 3C depict a memory cell 300, the unit that is repeated in the memory array, and more fully described in connection with FIG. 4.

The structure depicted in FIG. 3A may be an idealized or simplified embodiment. Typically, one or more barrier layers and/or seed layers may be required depending upon the fabrication process and the materials comprising the memory element, the non-ohmic device and the array lines. In addition, the non-ohmic device 320 may be a multi-layered structure having a degree of complexity commensurate with the requirements of the circuit element.

The material comprising the memory element should most fundamentally have I-V characteristics at least approximating those shown in FIG. 1. Various types of material meet this requirement. Many of these also exhibit colossal magnetoresistive effects. While not wishing to be bound by theory, it is believed that these various effects may derive from the same underlying physical phenomena in some materials. The patent application titled, "Method For Switching The Properties Of Perovskite Materials Used In Thin Film Resistors," to Shangqing Liu, et al., U.S. Pat. No. 6,204,139 fully describes various complex metal oxides exhibit the reversible multi-resistance state properties outlined above. U.S. Pat. No. 6,204,139 is hereby incorporated by reference in its entirety for all purposes.

$Pr_{0.7}Ca_{0.3}MnO_3$, $La_{0.7}Ca_{0.3}MnO_3$, $Gd_{0.7}Ca_{0.3}BaCo_2O_5$, $SrZrO_3$, and $SrTiO_3$ are specific examples of complex metal oxides that exhibit the desired reversible multi-resistance. In addition to being complex metal oxides, some of these materials have a perovskite crystal structure. Note that the resistive memory components employed in this invention are not limited to either complex metal oxide or perovskite crystal lattice structure. Any material approximating the V-I characteristics described above or meeting other requirements described elsewhere herein may be suitable for use as a memory element of this invention.

As indicated, the non-ohmic device should have I-V characteristics at least approximating those shown in FIG. 2B. Various circuit components meet this requirement. In one embodiment, the element is a combination of two oppositely oriented diodes connected in series. When two diodes are oppositely oriented, one diode's forward current is blocked by the other diode at low voltages (e.g., voltages between $-V_{NO}$ and $V_{NO}$). But at the breakdown voltage of each diode, the resistance to current flow diminishes greatly. Hence, in this embodiment, it is the diodes' breakdown voltages that define $V_{NO}$ and $-V_{NO}$. Some well known diodes are (i) a PN junction diode, in amorphous, microcrystalline, polycrystalline or single crystal semiconductor (e.g. Si, Ge, SiGe, GaAs, InP, etc.); (ii) a metal-semiconductor Schottky diode; (iii) a junction field-effect transistor with gate connected to source (or to drain); (iv) a MOSFET with gate either floating, or connected to source or connected to drain; (v) a Zener diode, avalanche diode, or tunnel diode; (vi) a four-layer diode (SCR); (vii) a P-I-N diode in amorphous, microcrystalline, polycrystalline or single crystal semiconductor; and others that will be readily apparent to those skilled in the art. Another implementation of the non-ohmic device comprises two oppositely oriented diodes connected in parallel. Yet another implementation comprises a metal-insulator-metal (MIM) tunneling device.

A preferred embodiment of the non-ohmic element would be constructed from the same material as the memory element. Both the non-ohmic element and the memory element could then be contained in a single layer of the memory plug.

Peripheral Circuitry and Array Design

Figure 4A:
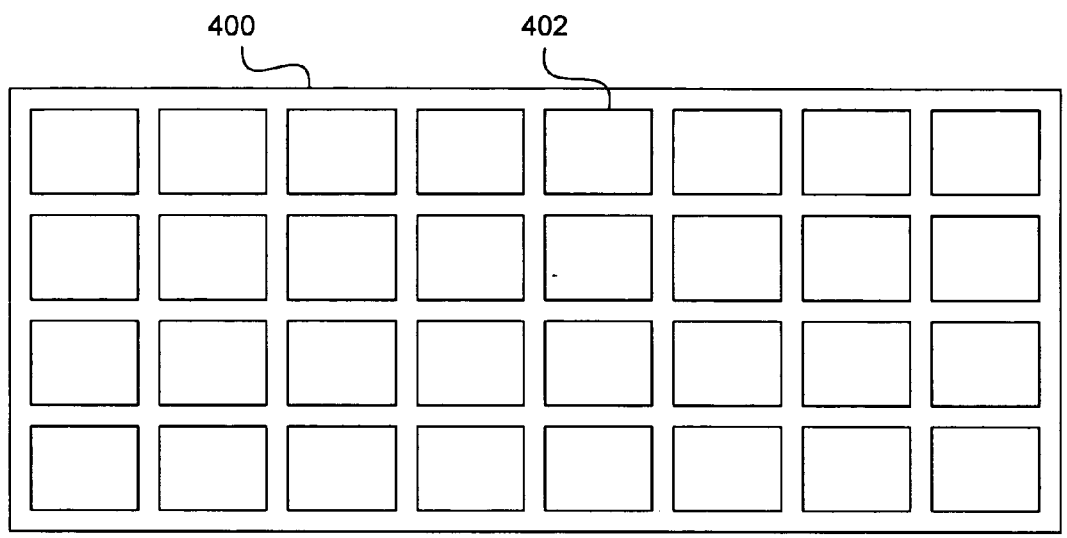
FIG. 4A is a block diagram depicting an exemplary high-density NVRAM.

FIG. 4A is a block diagram of an exemplary high-density NVRAM 400 with 32 bit blocks. A single bit block 402 contains substantially all the circuitry that would be required to store a single bit of information. Each bit block is responsible for a separate bit in a multi-bit address and provides a separate I/O operation. If the high-density NVRAM had 32 bit blocks, then 32 bits could be accessed in a single cycle. One benefit to designing the high density NVRAM 400 with bit blocks is that once a single bit block is designed, the same design can be replicated for each desired bit block.

Figure 4B:
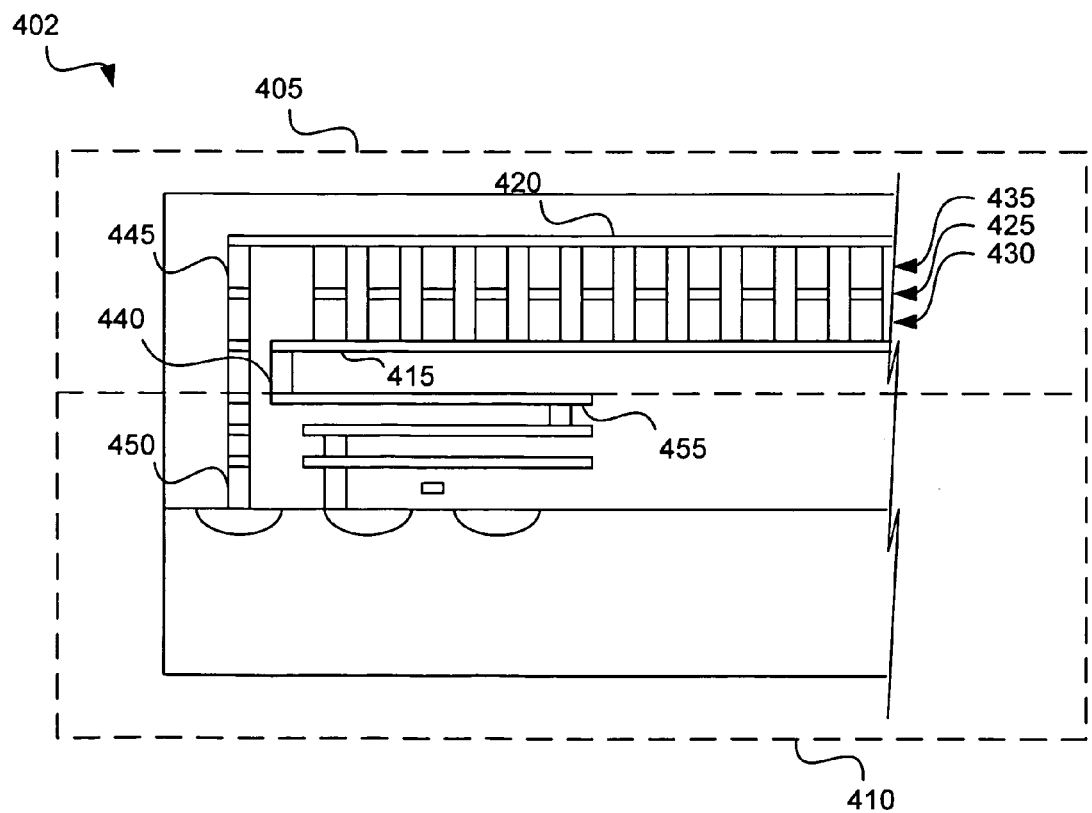
FIG. 4B is a cross-section depicting an exemplary bit block of a high-density NVRAM.

FIG. 4B depicts a cross-section of a bit block 402 of an exemplary high-density NVRAM 400. The high-density NVRAM 400 is preferably made up an array portion 405 and a memory circuit portion 410. The memory circuit portion 410 contains all of the active devices (devices that require a source of energy for their operation, such as transistors and amplifiers) needed to operate the high-density NVRAM 400. The circuitry of the memory circuit portion 410 will be described in connection with FIG. 6 and those skilled in the art will recognize that standard fabrication techniques (e.g., CMOS processing) can be used to manufacture the memory circuit portion 410.

The array portion 405 includes a first layer of x-direction conductive array lines ($X_0$ layer) 415, a second layer of x-direction conductive array lines ($X_1$ layer) 420, a layer of y-direction conductive array lines ($Y_0$ layer) 425, a first memory plug layer ($ML_0$) 430 situated between the $X_0$ layer 415 and the $Y_0$ layer 425, a second memory plug layer ($ML_1$) 435 situated between the $Y_0$ layer 425 and the $X_1$ layer 420, a first plurality of $X_0$ thrus 440 and a first plurality of $X_1$ thrus 445. A plurality of vias 450 and metallization layers 455 together provide conductive paths from components of the memory circuit portion 410 to memory cells of the array portion 405. Similarly, the thrus 440 and 445 provide conductive paths from memory cells of the array portion 405 to the memory circuit portion. It should be noted that the thrus of the array portion 405 must be conductive and, therefore, will have different electrical properties that the memory layers at the same height.

Due to the limitations of the cross-section view, only a single $X_0$ conductive array line, $X_1$ conductive array line, $X_0$ thru and $X_1$ thru are visible. Additionally, although a break line is depicted, the $X_0$ conductive array lines and the $X_1$ conductive array lines should have some mechanism that completes the electrical circuit, such as a second plurality of $X_0$ thrus and a second plurality of $X_1$ thrus that connect the $X_0$ and $X_1$ conductive array lines with the memory circuit portion 410. Similarly, although not shown in FIG. 4B, the $Y_0$ conductive array lines 425 would connect with the memory circuit portion 410 in the same manner as the $X_0$ and $X_1$ conductive array lines.

In a preferred embodiment, the array portion 405 contains only passive devices such as the memory cell of FIG. 3B. Since no transistor or other access device is required, and each cell only needs a pair of conductive array lines and memory plug, each cell can approach a minimum cell size of $4F^2$, where F is the minimum feature size as shown in FIG. 3C. This is due to the fact that all the conductive array lines, memory plugs, and spacing in between conductive array lines can all be fabricated to a width of F. Optimally, both the top and bottom surface of the $Y_0$ layer 425 are used, allowing a single set of $Y_0$ conductive array lines to access all memory plugs in both $ML_0$ 430 and $ML_1$ 435. Therefore, the repeatable cell that makes up the array of the array portion 405 can be considered to be the memory plug, plus ½ of the space around the memory plug, plus ½ of an x-direction conductive array line and ½ of a y-direction conductive array line. Of course, ½ of a conductive array line is merely a theoretical construct, since a conductive array line would be the same width, regardless of whether both surfaces of the conductive array line were used. Accordingly, the top and bottom layers of conductive array lines (which use only one surface) would be fabricated to the same size as all other layers of conductive array lines.

Figure 5A:
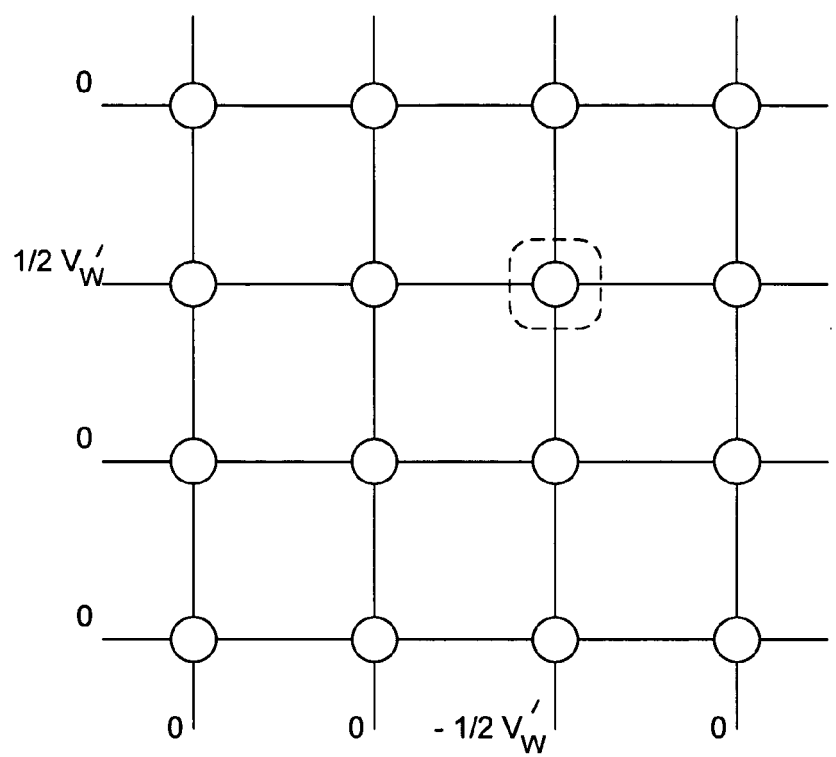
FIG. 5A is a block diagram depicting an example of writing a 1 to the array portion.
Figure 5B:
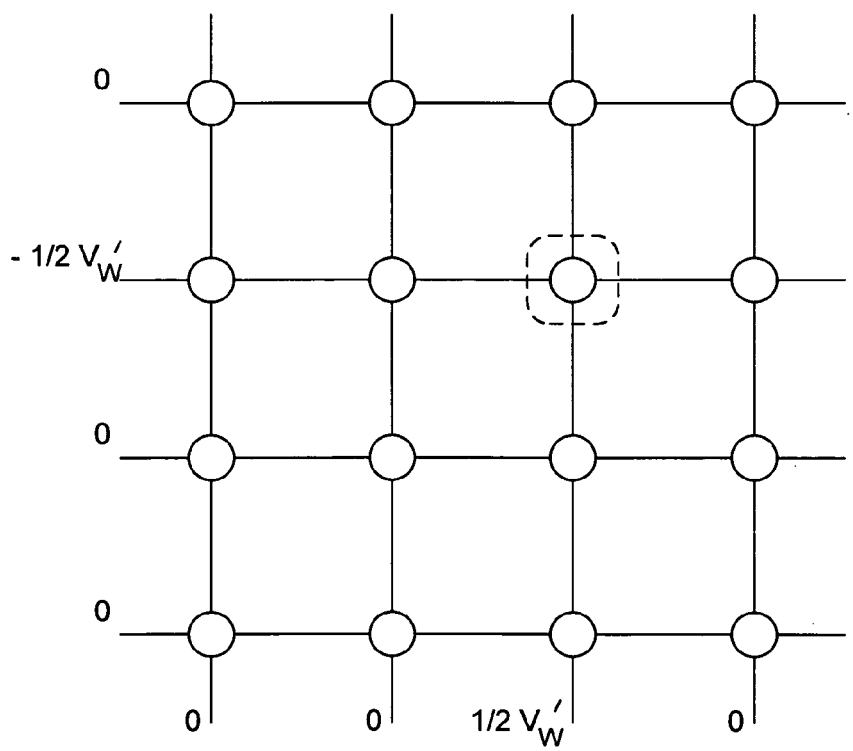
FIG. 5B is a block diagram depicting an example of writing a 0 to the array portion.

As previously discussed in connection with FIG. 2C, a single conductive array line can safely carry half of $|V_R'|$ or $|V_W'|$ without disturbing any unselected memory element. Since only a single selected memory element would receive the full $|V_R'|$ or $|V_W'|$ (½ from the x-direction and ½ from the y-direct element can be uniquely read from or written to. FIG. 5A illustrate an example of writing a 1, and FIG. 5B illustrates an example of writing a 0. If $V_W'$ is 6V and $-V_W'$ is $-6V$, then each conductive array line must be capable of raising its voltage to 3V or lowering its voltage to $-3V$.

Referring back to FIG. 4B, if size is a consideration, the array portion 405 can be designed to occupy roughly the same footprint as the memory circuit portion 410. If more storage is desired, additional memory layers can be used, adding to the height of the high-density NVRAM 400, and not its length or width.

Figure 6:
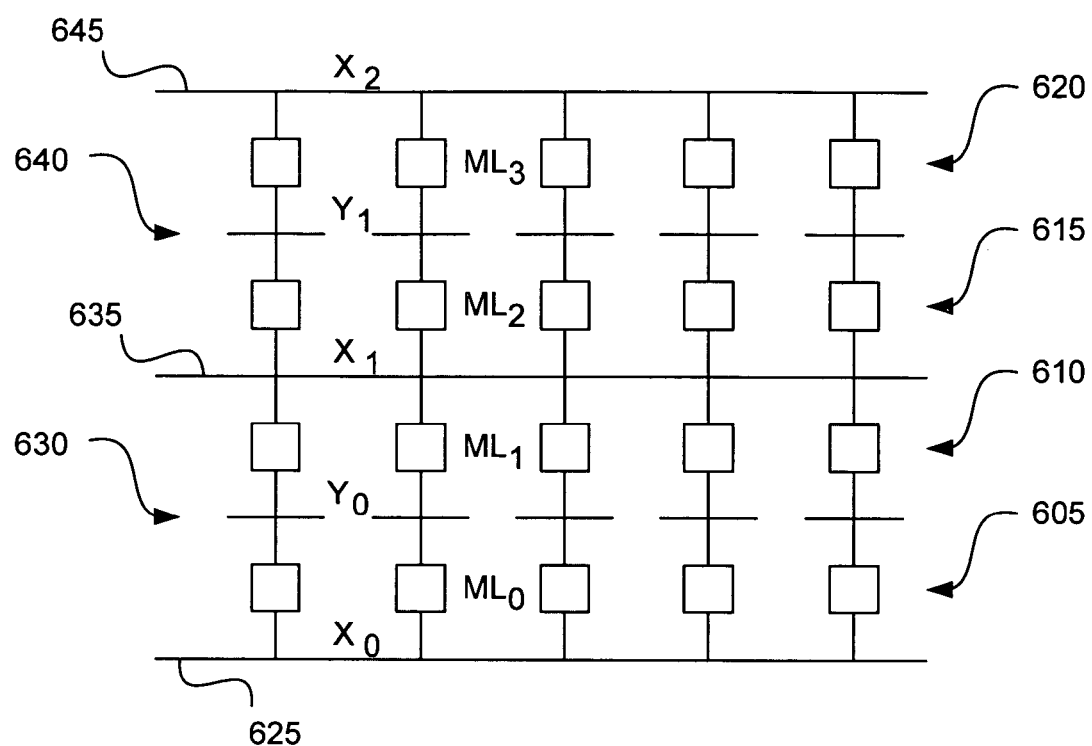
FIG. 6 is a block diagram depicting one possible configuration of four memory layers.

FIG. 6 is a block diagram of one possible configuration of four memory layers $ML_0$ 605, $ML_1$ 610, $ML_2$ 615 and $ML_3$ 620. Assuming that at least some of the conductive array lines can be used to deliver current to the memory plugs located both above and below the associated conductive line layer, five layers of conductive array lines ($X_0$ layer 625, $Y_0$ layer 630, $X_1$ layer 635, $Y_1$ layer 640, and $X_2$ 645) would be necessary. However, not every layer of conductive array lines would need to be uniquely addressable.

Table 2 shows the combinations of x-direction conductive array lines and y-direction conductive array lines that are necessary to activate a memory element on a specific memory layer.

TABLE 2

| $X_0$, $X_2$ | $X_1$ | $Y_0$ | $Y_1$ | Memory Layer |
|---|---|---|---|---|
| x |   | x |   | $ML_0$ |
|   | x | x |   | $ML_1$ |
|   | x |   | x | $ML_2$ |
| x |   |   | x | $ML_3$ |

Therefore, to access a memory cell on $ML_1$ 610, for example, one conductive array line from the $X_1$ layer 630 and one conductive array line from the $Y_0$ layer 635 would need to be activated.

Generally speaking, although N memory layers would require N+1 layers of conductive array lines, each conductive layer would not need to have its own separate circuitry. In this example, the outermost x layers of conductive array lines (the $X_0$ layer 625 and the $X_2$ layer 645) are logically related for accessing memory elements and may share a common set of thrus to access the same circuitry.

Figure 7:
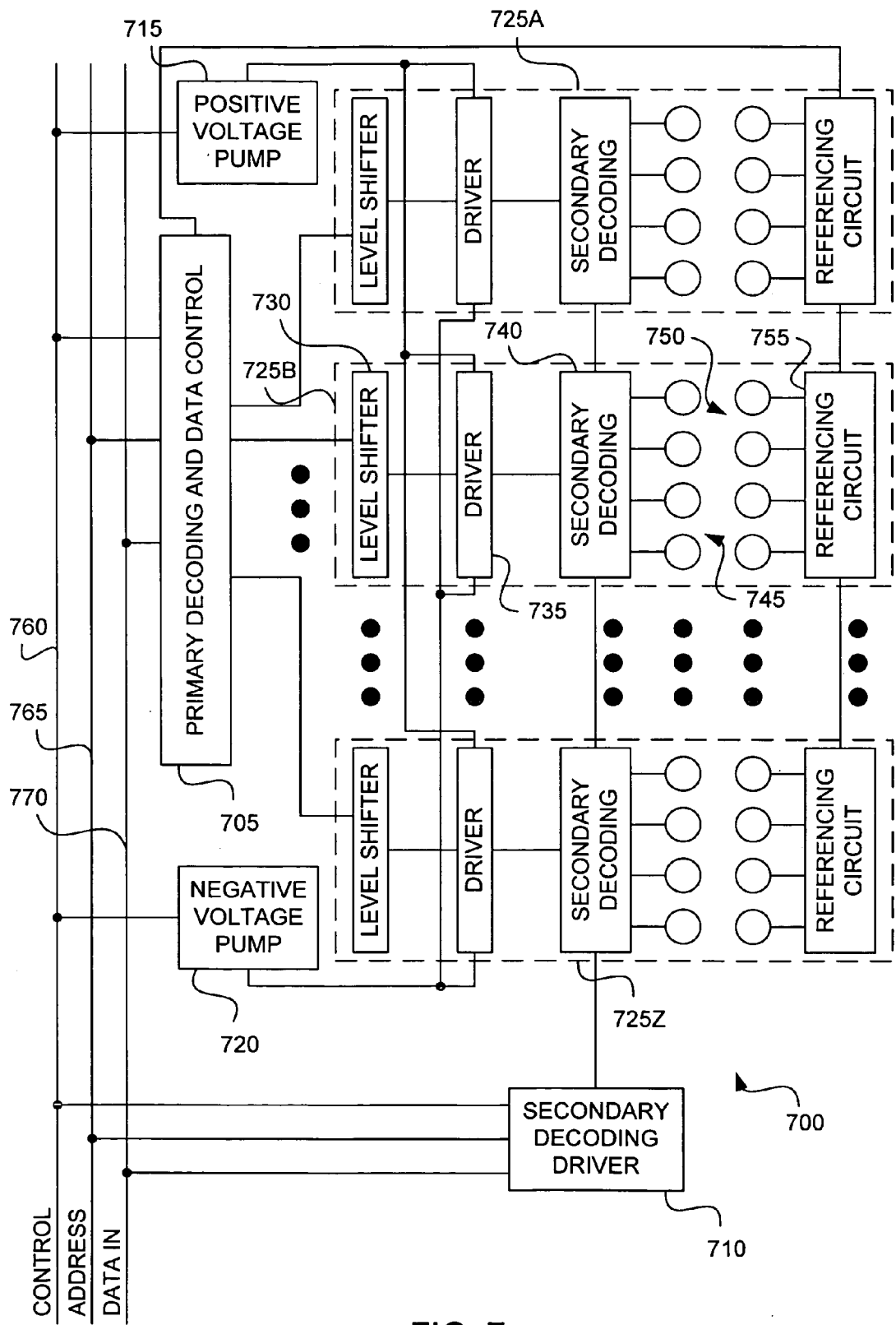
FIG. 7 is a block diagram depicting the write circuitry on the memory circuit portion associated with half a bit block.

FIG. 7 is a block diagram of the write circuitry 700 on the memory circuit portion 410 associated with a portion of a given bit block. Specifically, the write circuitry 700 is appropriate only for one direction of conductive array lines. A full bit block write circuit would require write circuitry for both directions of conductive array lines.

The write circuitry 700 includes a primary decoding and data control circuit (primary decoder) 705, a secondary decoding driver 710, a positive voltage pump 715, a negative voltage pump 720, and peripheral bank circuitry 725A, 725B and 725Z for driving a number of contiguous conductive array lines. The peripheral bank circuitry 725A, 725B and 725Z is responsible for activating a sub-set of the conductive array lines that make up a single bit block. Each instance of peripheral bank circuitry 725A, 725B or 725Z contains a level shifter 730, a driver 735, secondary decoding circuitry 740, a set of first vias 745 to the associated conductive lines, a set of second vias 750 also to the associated conductive lines, and a referencing circuit 755 that ensures the conductive array lines are grounded before or after every cycle. The referencing circuit 755 can either be a separate from, or integrated in, the other components (e.g., driver 735 or secondary decoding circuitry 740), making the second set of vias 750 unnecessary. Although only four vias are shown in the first set of vias 745 and the second set of vias 750, there may be more than four conductive lines controlled by each via. As previously mentioned, multiple layers of conductive lines might be controlled by a single set of vias 745 and 750.

The inputs to the write circuitry 700 include a control line 760 that carries information indicating what operation is to be performed (typically read or write), an address line 765 that carries information uniquely identifying the memory location, and a data line 770 that carries the information to be stored on the memory element. When a write request comes in, the primary decoder 705 processes the data on the address line 765 and determines which peripheral bank circuitry 725A, 725B or 725Z is associated with the memory element.

The secondary decoding driver 710 also processes the data on the address line 765. However, instead of determining which bank is associated with the memory element, the secondary decoding driver 710 determines which "grouping" of conductive array lines is associated with the memory element. For example, the secondary decoding driver 710 might determine that the desired memory element is on the third conductive array line of a bank, but would not need to know which bank the memory element was associated with. Together, the primary decoder 705 and the secondary decoding driver 710 can identify a single conductive line associated with the selected memory element.

The level shifter 730, driver 735, positive voltage pump 715 and negative voltage pump 720 are all used to deliver the necessary voltage to the appropriate bank of conductive array lines during a write. The positive voltage pump 715 steps up the $V_{CC}$ of the circuit to $\frac{1}{2} V_W'$ and the negative voltage pump 730 changes $V_{CC}$ to $-\frac{1}{2} V_W'$. Those skilled in the art will appreciate that varying the size of the voltage pumps 715 and 730 would vary how many would be needed on the high-density NVRAM 400. A large enough pump could, for example, supply both bit block halves, or even multiple bit blocks. A smaller pump might be used, for example, to drive a single instance of peripheral bank circuitry. The other components 705–770 of the write circuitry 700, however, are required for every bit block half.

Figure 8:
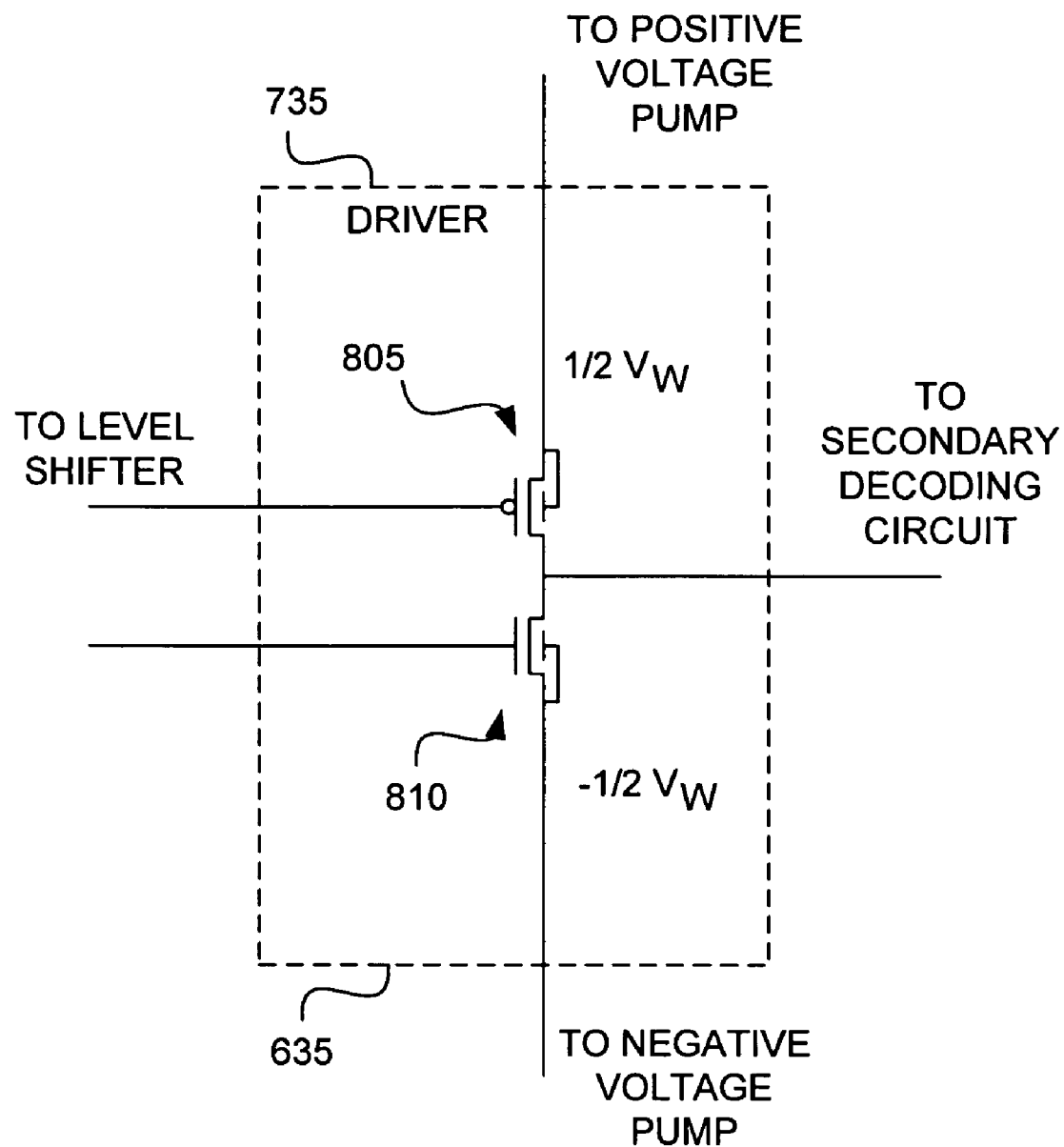
FIG. 8 is a block diagram depicting one possible driver configuration.

FIG. 8 is a block diagram of one possible driver 735 configuration. A p-channel transistor 805 and an n-channel transistor 810 are arranged in series. The n-channel transistor may be in a separate well from the CMOS logic because its substrate is tied to a negative voltage. The source of the p-channel transistor 805 is connected to the positive voltage pump 715 and the source of the n-channel transistor 810 is connected to the negative voltage pump 730. The level shifter must change the output voltages of the primary decoder 705 to appropriate threshold gate voltages to control driver transistors 805 and 810.

For example, if the primary decoder 705 determines that a 1 must be written to the bank associated with the peripheral bank circuitry 725B and the write circuitry 700 is associated with the x-direction of conductive array lines, it must send a signal that would ultimately cause the driver 735 of that bank to turn on its p-channel transistor 805. The n-channel transistor 810 of that bank would be turned off, as would all the other n-channel and p-channel transistors of all the other banks 725A and 725Z. The p-channel transistor 805 that is on would then raise the input voltage of the secondary decoding circuitry to $\frac{1}{2} V_W'$. In one exemplary embodiment, 0V from the level shifter 730 would fully turn on the p-channel transistor 805 and $\frac{1}{2} V_W'$ from the level shifter 730 will fully turn off the p-channel transistor. Similarly, the n-channel transistor 810 could have similar characteristics, requiring 0V to be fully turned on and $-\frac{1}{2} V_W'$ to be fully turned off.

Figure 9:
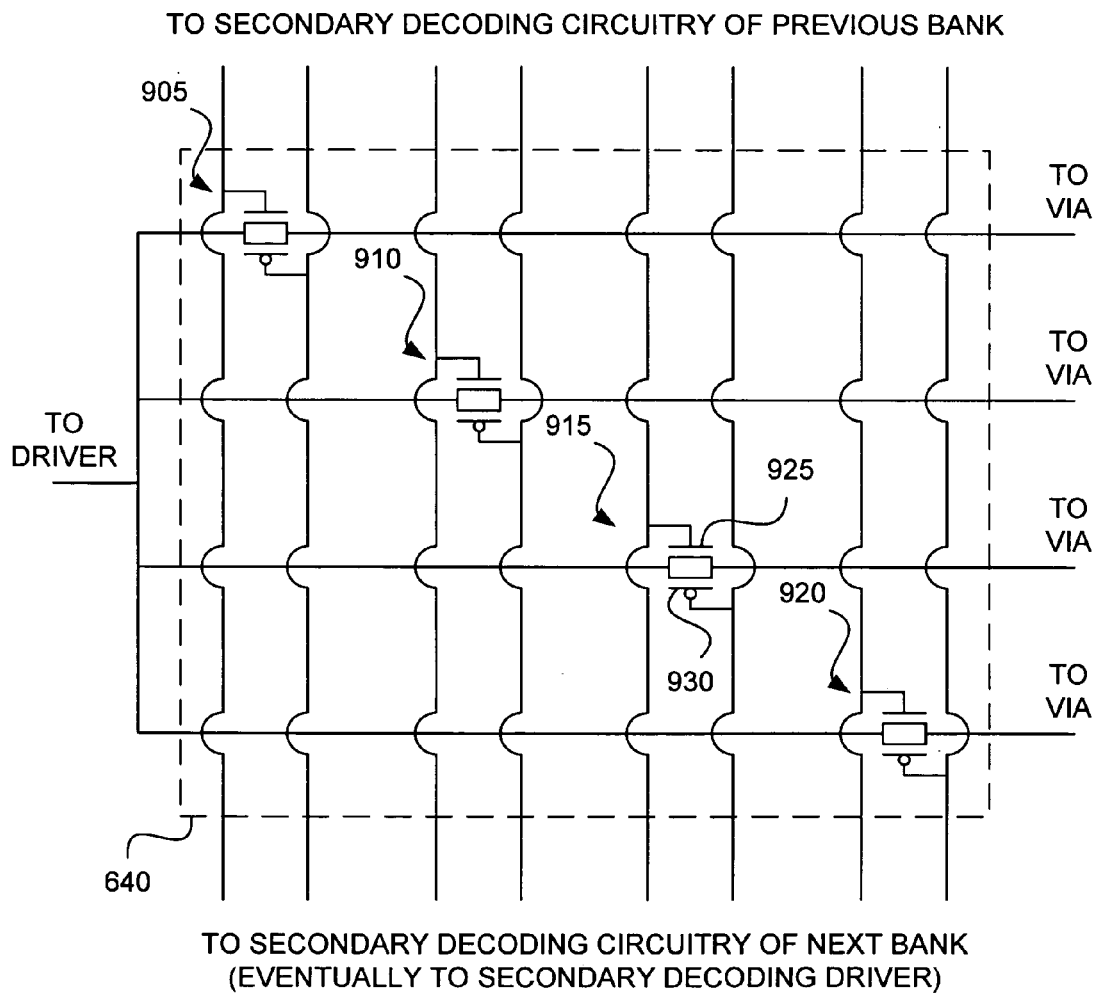
FIG. 9 is a block diagram depicting one possible secondary decoding circuit configuration.

FIG. 9 is a block diagram of one possible secondary decoding circuit 740 configuration. If the peripheral bank decoding circuitry 725 B were responsible for four conductive array lines, then there would be four pass devices 905, 910, 915 and 920. Each pass device has an n-channel transistor and a p-channel transistor in parallel whose gates are separately controlled by the secondary decoding driver 710 and whose sources are connected to the output of the driver 730. If voltage from the driver 735 is $\frac{1}{2} V_W'$ and a write operation is desired, then the selected pass device 915 could have a threshold voltage that turns on its n-channel transistor 925 with a gate voltage of $\frac{1}{2} V_W'$ and turns on the p-channel transistor 930 with a gate voltage of 0V. Of course, only one transistor is necessary to allow current to flow, but turning on both allows the entire circuit to respond quicker. The other three pass devices 905, 910 and 920 would be off with the gate voltages of the n-channel transistors at, for example, 0V and the gate voltage of the p-channel transistors at $\frac{1}{2} V_W'$. Since only one pass device would allow current to flow, only one via would be brought up to $\frac{1}{2} V_W'$.

Figure 10A:
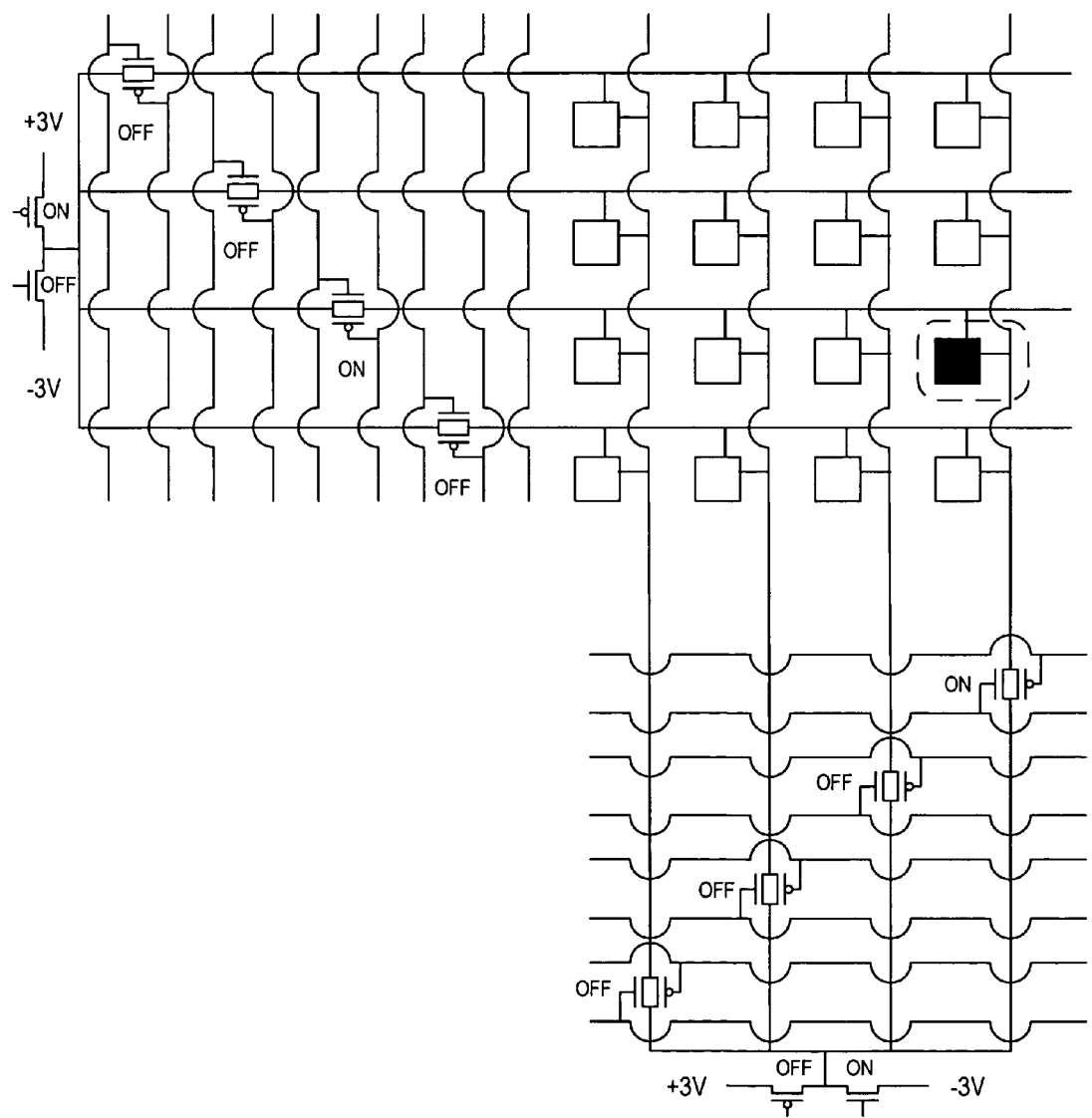
FIG. 10A is a block diagram depicting some of the systems that contribute to writing a 1 to a particular memory cell.
Figure 10B:
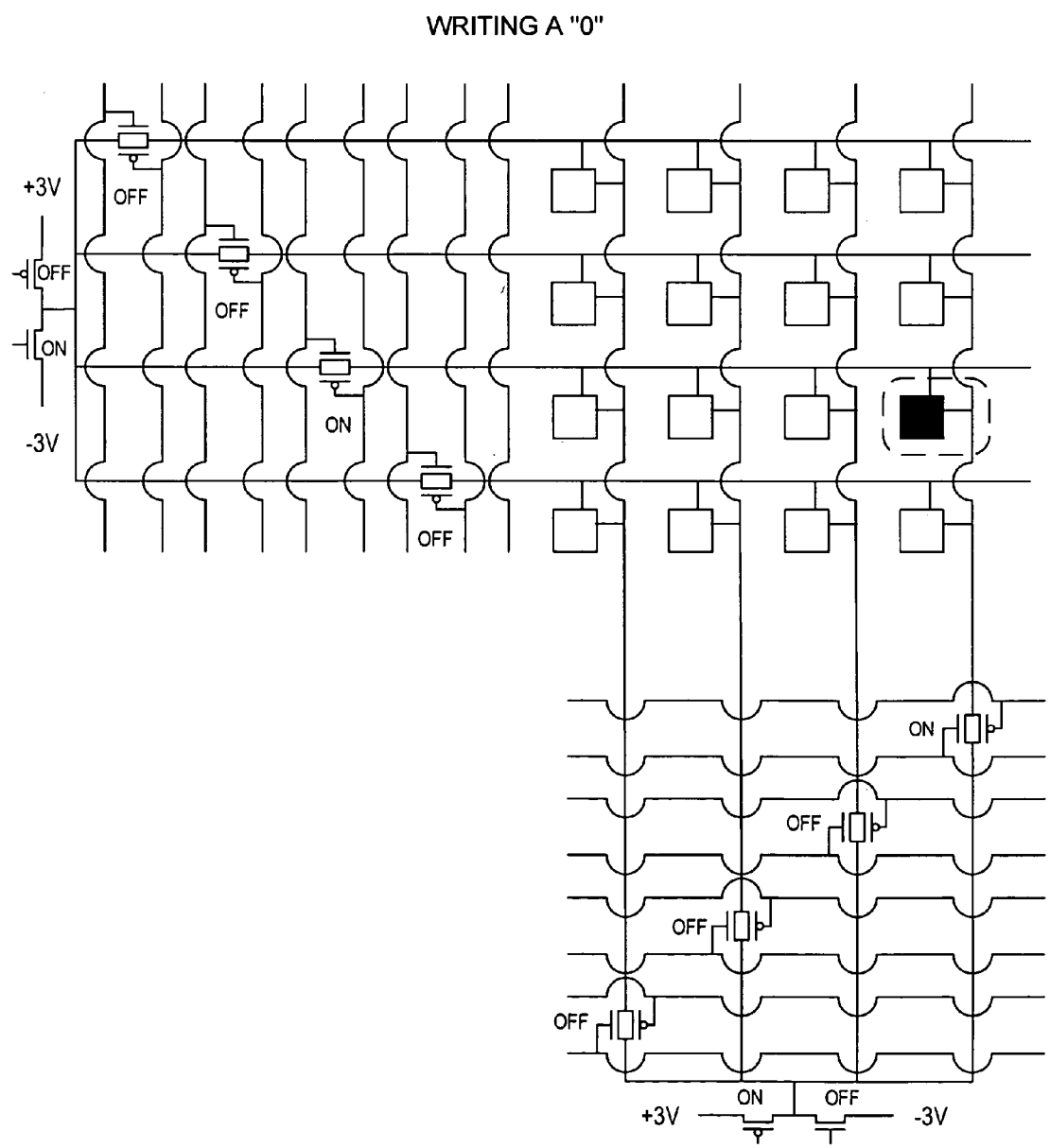
FIG. 10B is a block diagram depicting some of the systems that contribute to writing a 0 to a particular memory cell.

FIGS. 10A and 10B are block diagrams of some of the systems that contribute to writing a 1 or a 0 to a particular memory cell. It should be noted that the driver's 735 n-channel transistor 810 would be on instead of its p-channel transistor 805 for writing a 0. As a result, the voltage from the driver 735 would be $-\frac{1}{2} V_W'$. The selected pass device 915 would be on when the n-channel transistor's 925 voltage is, for example, at 0V and the p-channel transistor's 930 voltage is at $-\frac{1}{2} V_W'$. The other three pass devices 905, 910 and 920 would be off, with the gate voltage of the n-channel transistors at $-\frac{1}{2} V_W'$ and the gate voltage of the p-channel transistors at 0V.

Those skilled in the art will appreciate that repeatedly writing a 1 or a 0 to the same memory element would not bias the memory element if already in saturation. However, if the memory element were not in saturation, then a write operation should only be performed when the value in the memory element must change. In such a case, a read operation would be necessary before determining whether a write operation was appropriate.

Figure 11A:
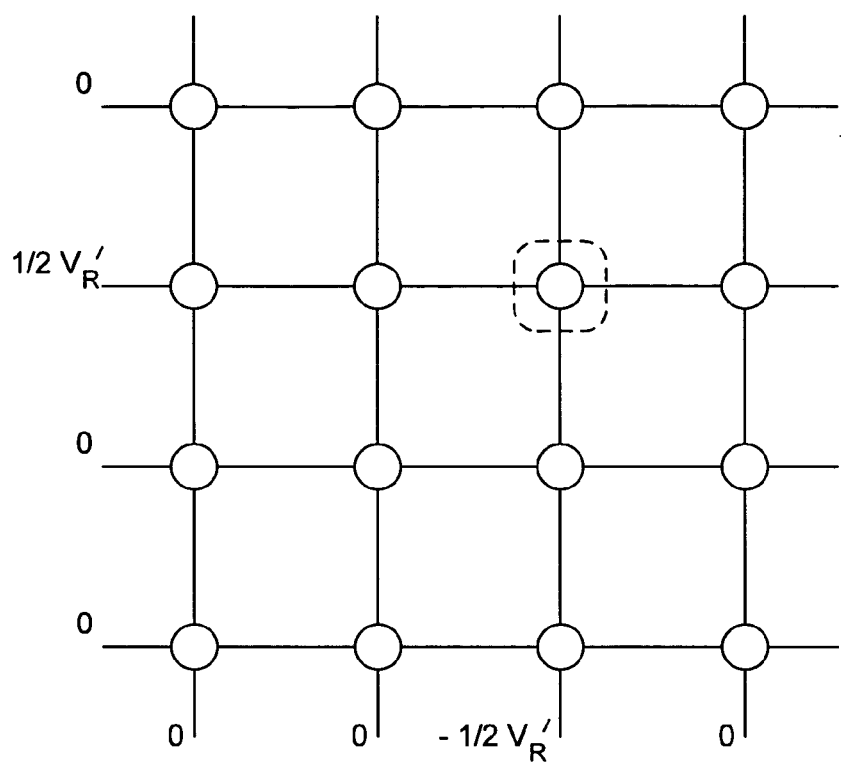
FIG. 11A is a block diagram depicting an example of a positive read from the array portion.
Figure 11B:
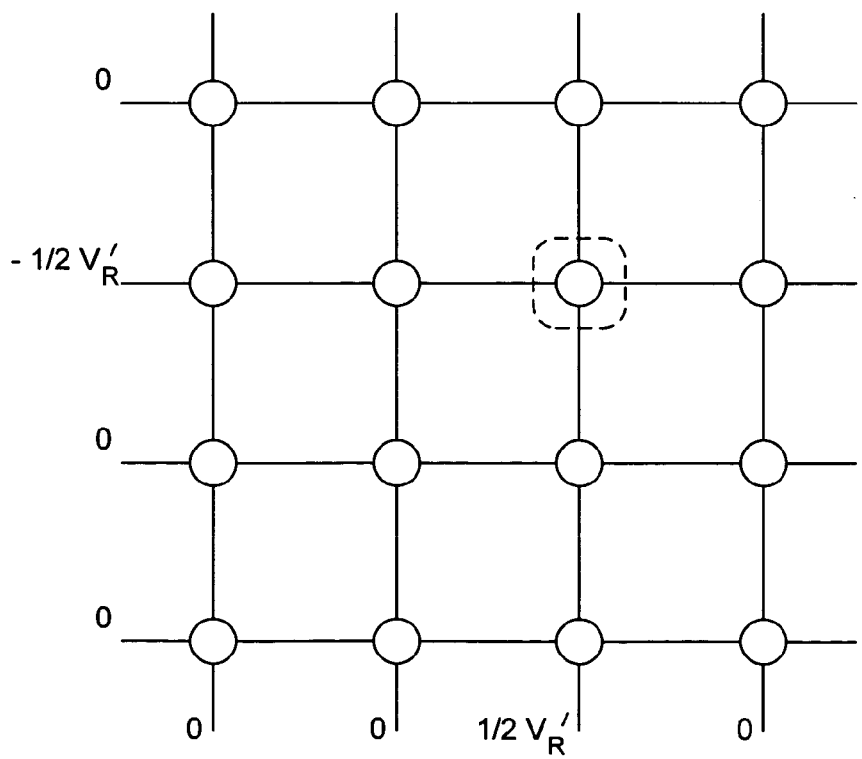
FIG. 11B is a block diagram depicting an example of a negative read from the array portion.

The inventors theorize that, during a read operation, it would be beneficial to switch polarities of the read to minimize long-term disruption to the high-density NVRAM 400. FIG. 11A illustrates an example of what could be called a "positive" read and FIG. 11B illustrates an example of what could be called a "negative" read. Both positive and negative reads deliver a full $|V_R'|$ across the selected memory cell.

Switching polarities can be accomplished by simply having the reads alternate between positive and negative with every read. Although the chances that a single memory cell will have two consecutive reads are low, over the lifetime of the high-density NVRAM 400 all the memory cells should have had roughly the same amount of positive reads as negative reads.

Figure 12:
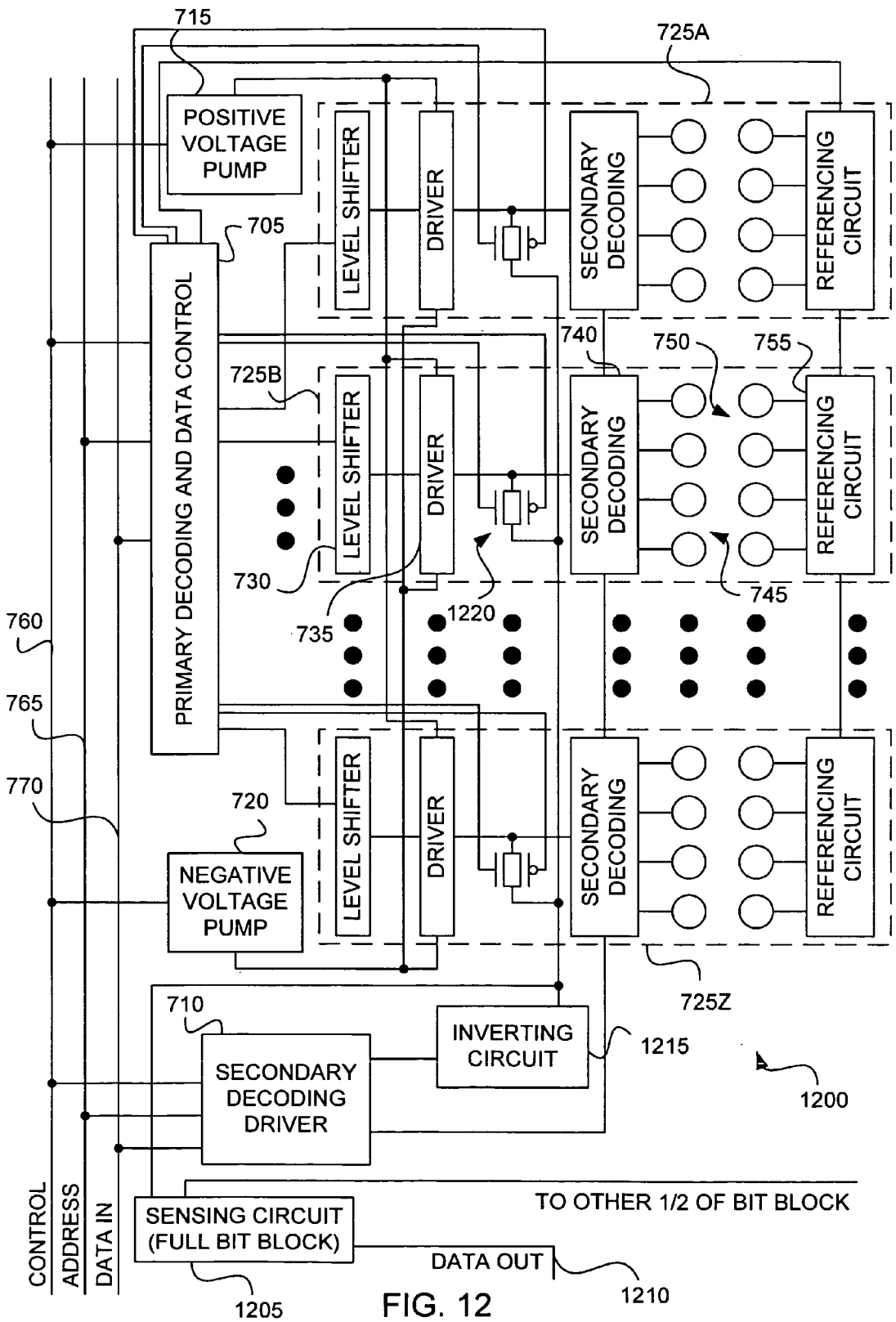
FIG. 12 is a block diagram of the read circuitry 1200 on the memory circuit portion 410 associated with half of a bit block.

FIG. 12 is a block diagram of the read circuitry 1200 on the memory circuit portion 410 associated with halfofa bit block. Similar to the write circuitry 700, the read circuitry 1200 is appropriate only for one direction of conductive array lines. A full bit block read circuit would require read circuitry for both directions of conductive array lines.

The read circuitry 1200 can use much of the same circuits as the write circuitry 700. Fundamentally, the only two differences between the reading and writing operations are that $|V_R|$ is less than $|V_W|$ and an output is desired. A sensing circuit 1205 handles the output. Optimally, the sensing circuit 1205 will compare the results from both halves of the bit block. Only a single sensing circuit 1205 is therefore required for a full bit block.

Figure 13:
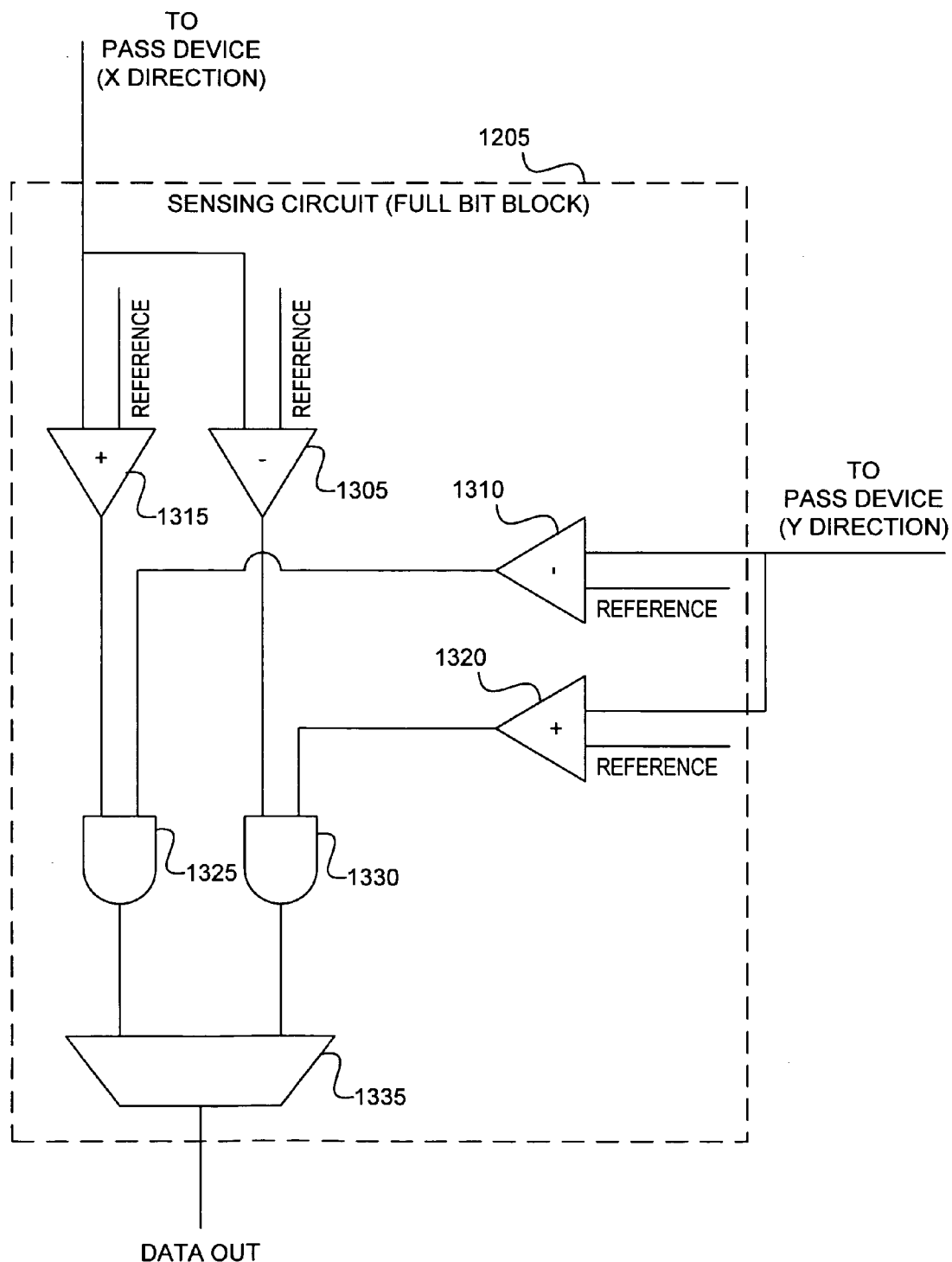
FIG. 13 is a circuit diagram of an exemplary full bit block sensing circuit.

FIG. 13 is a circuit diagram of an exemplary full bit block sensing circuit 1205. The sensing circuit 1300 contains two inverting differential amplifiers 1305 and 1310, two non-inverting differential amplifiers 1315 and 1320, two AND gates 1325 and 1330, and a multiplexer 1335.

The differential amplifiers 1305, 1310, 1315, and 1320 take their inputs from either the x-direction bit block half or the y-direction bit block half. During a positive read, the x-direction bit block will cause its non-inverting differential amplifier 1315 to output either a 0 signal or a 1 signal, depending on the resistive state of the memory element. If the voltage starts to increase towards the positive voltage pump 715 voltage, the non-inverting differential amplifier 1315 will output a 1 signal to the AND gate 1325. Similarly, the y-direction bit block will cause its inverting differential amplifier 1310 to output a 1 signal if the voltage starts to decrease towards the negative voltage pump 720 voltage. Therefore, if both the x-direction and the y-direction lines indicate that the selected memory cell is in its higher resistive state, then the AND gate 1325 will output a 1 signal. Conversely, if the selected memory cell is in its lower resistive state, and the non-inverting differential amplifier 1315 receives an input voltage that decreases towards ½ $V_R$, it will output a 0 signal. Similarly the y-direction non-inverting differential amplifier 1315 will output a 0 signal if it receives an input voltage that decreases towards −½ $V_R$.

If the read polarity is shifted, then the x-direction inverting differential amplifier 1305 will output a 1 signal if it receives an input voltage decreasing towards the negative voltage pump 720 voltage and the y-direction non-inverting differential amplifier 1320 will output a 1 signal if it receives an input voltage increasing towards the positive voltage pump 715 voltage, causing the appropriate AND gate 1330 to output a 1 signal. The multiplexer 1335 selects the AND gate 1325 or 1330 that is appropriate for the polarity of the read, and outputs the result to a data output line 1210, depicted in FIG. 12.

In the embodiment depicted in FIG. 12, the positive voltage pump 715 and the negative voltage pump 720 have a static output. However, since $|V_R|$ is less than $|V_W|$, the secondary decoding circuit needs to pass less than the full voltage from the voltage pumps 715 and 720. This can be accomplished by only partially turning on a transistor in the appropriate pass gate 915. For example, if the sources of the pass device's 915 transistors are at 3V (a positive polarity read) and the p-channel transistor 930 was turned off with a gate voltage of 3V, then the n-channel transistor 925 would need to have a gate voltage of approximately 2.5V to have its drain voltage at 2V. Conversely, if the sources of the pass device's 915 transistors are at −3V (a negative polarity read) and the n-channel transistor 925 was turned off with a gate voltage of −3V, then the p-channel transistor 930 would need to have a gate voltage of approximately −2.5V to have its drain voltage at −2V.

An inverting circuit 1215 can be used to create a feedback circuit. If the voltage from the pass device 915 starts to increase during a positive read, then the signal can be inverted, and the decreasing voltage can be used to further pull down the gate voltage of the n-channel transistor 925. Conversely, if the voltage from the pass device 915 starts to decrease during a negative read, then the signal can be inverted, and the increasing voltage can be used to further pull up the gate voltage of the p-channel transistor 930. Of course, the change in the gate voltage will be slight, so there is no danger of the gate voltage increasing enough to allow $V_{Wth}$ from being applied across the memory cell.

In order to prevent the feedback circuit from interfering with a write operation, a read/write pair of transistors 1220 is used to block the signal from the pass devices 905, 910, 915 and 920 during a write operation.

As indicated, the secondary decoding circuitry works with the primary decoding circuitry to select unique lines for access. It also distinguishes between read and write operations on a selected line. This allows the single line to both select a memory element and pass data to that element. This feature enables implementation of a cross-point architecture.

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A high density NVRAM comprising:
   a first layer of conductive array lines, the conductive array lines being arranged so that they do not come into direct contact with each other, each conductive array line having a plurality of bottom memory plug sites;
   a second layer of conductive array lines, the conductive array lines being arranged so that they cross over the conductive array lines of the first layer without coming into direct contact with each other or any of the conductive array lines of the first layer, each conductive array line having a plurality of top memory plug sites, each top memory plug site being located directly above a corresponding bottom memory plug site, the bottom memory plug site and its associated top memory plug constituting a memory plug site pair; and
   peripheral circuitry that receives a supply voltage of approximately 1.8 volts or less, generates voltages to conductive array lines of a magnitude not more than approximately 3 volts, senses current that is indicative of a nonvolatile memory state.

2. The high density NVRAM of claim 1, wherein the peripheral circuitry can access at least a megabit of information.

3. The high density NVRAM of claim 1, wherein each memory plug site pair can experience a voltage drop of a magnitude of not more than approximately 6 volts.

4. The high density NVRAM of claim 3, wherein the voltage drop experienced by memory plug site pairs are caused by the peripheral circuitry applying a first voltage to the first layer of conductive array lines and a second voltage to the second layer of conductive array lines, the second voltage being approximately equal in magnitude and opposite in polarity to the first voltage.

5. The high density NVRAM of claim 1, further comprising at least one additional layer of conductive array lines that is associated with at least one additional level of memory plug site pairs.

6. The high density NVRAM of claim 5, wherein:
   the second layer of conductive array lines has a plurality of second level bottom memory plug sites; and
   the at least one additional layer of conductive array lines are arranged so that they cross over the conductive array lines of the second layer without coming into direct contact with each other or any of the conductive array lines of the second layer, each conductive array line having a plurality of second level top memory plug sites, each second level top memory plug site being located directly above a corresponding second level bottom memory plug site, the second level bottom memory plug site and its associated second level top memory plug constituting a memory plug site pair.

7. The high density NVRAM of claim 6, wherein the at least one additional layer of conductive array lines includes at least three additional layers of conductive array lines and the at least one additional level of memory plug site pairs includes at least three additional levels of memory plug site pairs.

8. The high density NVRAM of claim 1, wherein a material having a substantially perovskite crystalline lattice structure is disposed in between the memory plug site pairs.

9. The high density NVRAM of claim 1, wherein a non-ohmic device is disposed in between the memory plug site pairs.

10. The high density NVRAM of claim 1, wherein the high density NVRAM has an effective density of not more than approximately 4 $F^2$, whereby F is the fabrication width.

11. The high density NVRAM of claim 1, wherein the high density NVRAM has an effective density of not more than approximately 1 $F^2$.

12. An apparatus comprising:
   a cross point array including
      a first layer of conductive array lines, the conductive array lines being arranged so that they do not come into direct contact with each other, each conductive array line having a plurality of bottom memory plug sites;
      a second layer of conductive array lines, the conductive array lines being arranged so that they cross over the conductive array lines of the first layer without coming into direct contact with each other or any of the conductive array lines of the first layer, each conductive array line having a plurality of top memory plug sites, each top memory plug site being located directly above a corresponding bottom memory plug site, the bottom memory plug site and its associated top memory plug constituting a memory plug site pair; and
   peripheral circuitry that receives an external supply voltage of approximately 1.8 volts or less, generates voltages to selected array lines in the cross point array of a magnitude not more than approximately 3 volts, and senses current that is indicative of a nonvolatile memory state.

13. The apparatus of claim 12, wherein the peripheral circuitry can access at least a megabit of information.

14. The apparatus of claim 12, wherein a material having a substantially perovskite crystalline lattice structure is disposed in between the memory plug site pairs.

15. The apparatus of claim 12, wherein a non-ohmic device is disposed in between the memory plug site pairs.

16. An apparatus comprising:
   a first layer of conductive array lines fabricated to a width F and having a plurality of bottom memory plug sites;
   a second layer of conductive array lines fabricated to a width F and having a plurality of top memory plug sites, each top memory plug site being located directly above a corresponding bottom memory plug site, the bottom memory plug site and its associated top memory plug constituting a memory plug site pair; and
   peripheral circuitry using fabrication widths of F that receives a supply voltage of approximately 1.8 volts or less, generates voltages to conductive array lines of a magnitude not more than approximately 3 volts, and senses current that is indicative of a nonvolatile memory state.

17. The apparatus of claim 16, wherein the peripheral circuitry can access at least a megabit of information.

18. The apparatus of claim 16, wherein a material having a substantially perovskite crystalline lattice structure is disposed in between the memory plug site pairs.

19. The apparatus of claim 16, wherein a non-ohmic device is disposed in between the memory plug site pairs.

* * * * *

UNITED STATES PATENT AND TRADEMARK OFFICE
CERTIFICATE OF CORRECTION

PATENT NO. : 7,180,772 B2
APPLICATION NO. : 11/179790
DATED : February 20, 2007
INVENTOR(S) : Rinerson et al.

It is certified that error appears in the above-identified patent and that said Letters Patent is hereby corrected as shown below:

On Title Page Item (73) for the Assignee.

Please Replace the words "Unity Semicondutor Corporation"

with the words --Unity Semiconductor Corporation--

Column 16, Line 30,

Please Replace the words "associated top memory plug"

with the words --associated top memory plug site--;

Column 16, Line 67,

Please Replace the words "memory plug constituting"

with the words --memory plug site constituting--;

Column 17, Line 35,

Please Replace the words "associated top memory plug constituting"

with the words --associated top memory plug site constituting--; and

UNITED STATES PATENT AND TRADEMARK OFFICE
CERTIFICATE OF CORRECTION

PATENT NO. : 7,180,772 B2
APPLICATION NO. : 11/179790
DATED : February 20, 2007
INVENTOR(S) : Rinerson et al.

It is certified that error appears in the above-identified patent and that said Letters Patent is hereby corrected as shown below:

Column 18, Line 22,

Please replace the words "memory plug constituting"

with the words --memory plug site constituting--.

Signed and Sealed this

First Day of May, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,180,772 B2 | Page 1 of 1 |
| APPLICATION NO. | : 11/179790 | |
| DATED | : February 20, 2007 | |
| INVENTOR(S) | : Rinerson et al. | |

It is certified that error appears in the above-identified patent and that said Letters Patent is hereby corrected as shown below:

Column 3, Line 52:

Please delete the words "SUMMARY OF THE INVENTION";

Column 3, Line 44:

Please replace the word "It" with the word --In--.

Signed and Sealed this

Seventeenth Day of July, 2007

JON W. DUDAS
*Director of the United States Patent and Trademark Office*